(12) United States Patent
Kobayashi et al.

(10) Patent No.: US 6,710,263 B2
(45) Date of Patent: Mar. 23, 2004

(54) SEMICONDUCTOR DEVICES

(75) Inventors: Toshiyuki Kobayashi, Tokai-mura (JP); Yasutoshi Kurihara, Hitachinaka (JP); Takumi Ueno, Mito (JP); Nobuyoshi Maejima, Komoro (JP); Hirokazu Nakajima, Saku (JP); Tomio Yamada, Tamamura-machi (JP); Tsuneo Endoh, Komoro (JP)

(73) Assignees: Renesas Technology Corporation, Tokyo (JP); Hitachi Tohbu Semiconductors, Ltd., Gunma (JP)

( * ) Notice: Subject to any disclaimer, the term of this patent is extended or adjusted under 35 U.S.C. 154(b) by 0 days.

(21) Appl. No.: 09/790,978

(22) Filed: Feb. 23, 2001

(65) Prior Publication Data

US 2001/0023983 A1 Sep. 27, 2001

(30) Foreign Application Priority Data

Feb. 28, 2000 (JP) .......................... 2000-55938

(51) Int. Cl.$^7$ ................................. H05K 1/16
(52) U.S. Cl. ...................... 174/260; 174/255; 174/256; 361/760; 361/792
(58) Field of Search .................. 174/260, 255, 174/256, 250; 361/760, 792, 783; 257/737, 778, 700; 674/250; 438/113, 462

(56) References Cited

U.S. PATENT DOCUMENTS

| | | | | |
|---|---|---|---|---|
| 5,252,519 A | * | 10/1993 | Nakatani et al. | 252/514 |
| 5,375,042 A | * | 12/1994 | Arima et al. | 174/255 |
| 5,464,950 A | * | 11/1995 | Horiuchi et al. | 174/250 |
| 5,488,542 A | * | 1/1996 | Ito | 174/259 |
| 5,683,791 A | * | 11/1997 | Horiuchi et al. | 428/210 |
| 5,714,801 A | * | 2/1998 | Yano et al. | 257/691 |
| 5,827,605 A | * | 10/1998 | Nishide et al. | 174/250 |
| 5,831,218 A | * | 11/1998 | Hu et al. | 174/250 |
| 5,847,326 A | * | 12/1998 | Kawakami et al. | 174/256 |
| 5,962,925 A | * | 10/1999 | Eifuku et al. | 257/738 |
| 5,969,426 A | * | 10/1999 | Baba et al. | 257/666 |
| 6,118,671 A | * | 9/2000 | Tanei et al. | 174/252 |
| 6,285,080 B1 | * | 9/2001 | Bezama et al. | 257/690 |
| 6,359,233 B1 | * | 3/2002 | Joy et al. | 174/250 |

FOREIGN PATENT DOCUMENTS

| | | | | |
|---|---|---|---|---|
| JP | 362112349 A | * | 5/1987 | |
| JP | 4-354355 | | 12/1992 | |
| JP | 5-304351 | | 11/1993 | |
| JP | 7-99260 | | 4/1995 | |
| JP | 08298381 A | * | 11/1996 | |
| JP | 11-163535 | | 6/1999 | |

* cited by examiner

Primary Examiner—Kamand Cuneo
Assistant Examiner—I B Patel
(74) Attorney, Agent, or Firm—Antonelli, Terry, Stout & Kraus

(57) ABSTRACT

In a semiconductor device, the likely occurrence of cracking of a ceramic substrate, and the consequential disconnection of internal layer wiring, due to thermal changes suffered when the semiconductor device is mounted on external wiring boards having different thermal expansion is prevented. The semiconductor device has a ceramic substrate, a wiring pattern formed on a first principal plane and having mounted semiconductor components, an external electrode portion formed on a second principal plane and connected to an external circuit, internal layer wiring formed inside said ceramic substrate to electrically connect said wiring pattern and said external electrode portion via through-hole wiring, and semiconductor components and a resin layer covering said semiconductor components, wherein the internal layer wiring is formed internally with respect to the side of said ceramic substrate with a clearance of at least 0.05 mm.

19 Claims, 16 Drawing Sheets

Conductor Hatching (For all through-holes in Fig. 10(a) - 10(c))

Ceramic Hatching

Conductor hatching

Resin Hatching

Ceramic Hatching

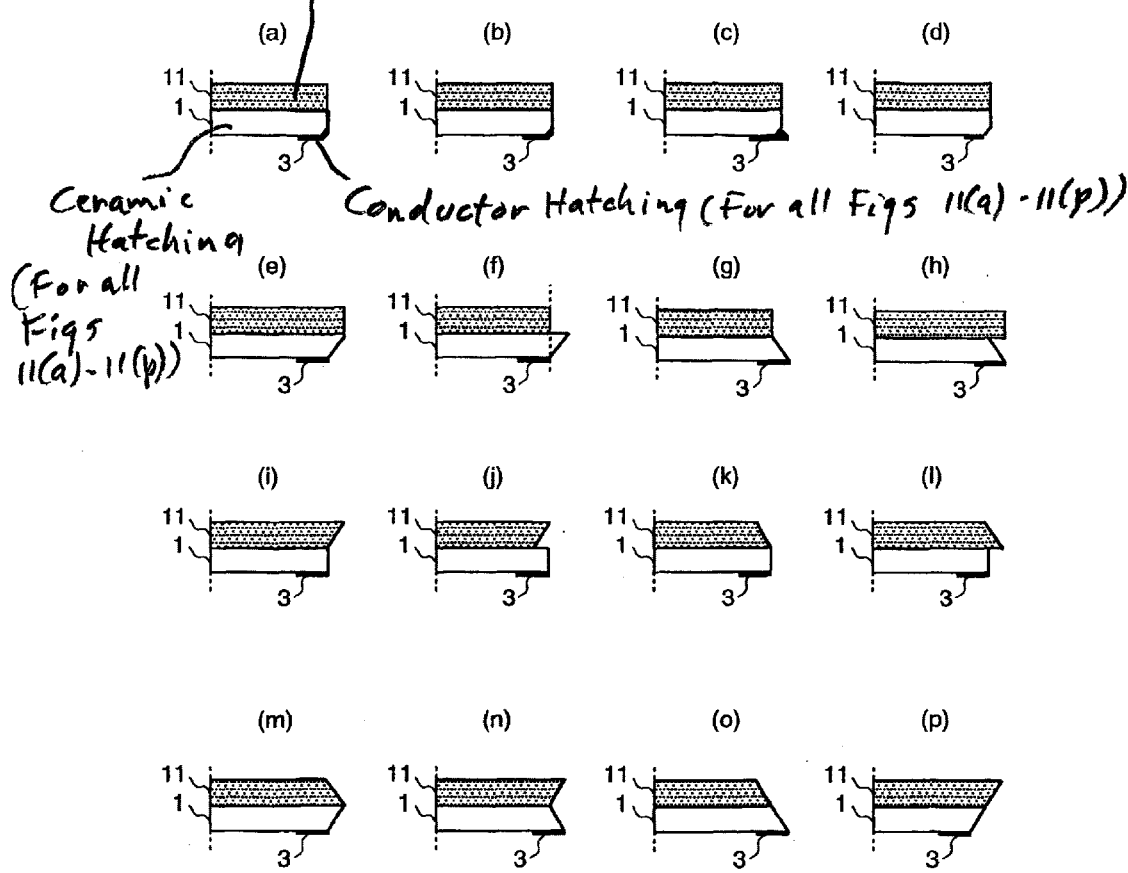

SEMICONDUCTOR DEVICES

BACKGROUND OF THE INVENTION

The present invention relates to semiconductor devices having resin-covered semiconductor components on a ceramic substrate.

An example of an existing semiconductor device, having internal layer wiring formed inside its wiring boards and having the side of its external electrode portion so formed as to share the same plane as the side of each wiring board, is set forth in Japanese Application Patent Laid-Open Publication No. Hei-354355 (1992).

Examples of an existing semiconductor device, having internal layer wiring formed inside its wiring boards are set forth in Japanese Application Patent Laid-Open Publication No. Hei-163535 (1999) and Hei-304351 (1993).

An example of an existing semiconductor device, having the side of its external electrode portion formed so as to share the same plane as the side of a wiring board, is set forth in Japanese Application Patent Laid-Open Publication No. Hei-99260 (1995).

In order to achieve a reduction in the wiring resistance developed inside the internal layer wiring, through-hole wiring, wiring patterns, and external electrodes of a semiconductor device, and an improvement in the response characteristics thereof, it is becoming the common to use copper (Cu), silver (Ag), gold (Au), or the like, as the lower-resistance materials for the above-mentioned wiring conductors, and to use cold-baked type ceramic substrates that can be baked simultaneously with the foregoing wiring conductors. In such a semiconductor device, temperature changes associated with the mounting of the semiconductor device on an external wiring board, such as a motherboard, and the repetition of temperature changes associated with the starts and stops of the semiconductor device after it has been mounted on the external wiring board cause stresses due to the differences in thermal expansion coefficient between the ceramic substrate and the external wiring board. These stresses, in turn, cause a separation between the internal layer wiring and ceramic substrate of the semiconductor device, and cracking of the ceramic substrate connections with the internal layer wiring results. No prior art allows for the avoidance of these problems.

SUMMARY OF THE INVENTION

An object of the present invention is to solve the above-mentioned problems and provide a semiconductor device that incorporates preventive measures against separation between the internal layer wiring and the ceramic substrate. Another object of the invention is to provide a semiconductor device that incorporates preventive measures against the cracking of the ceramic substrate connections with the internal layer wiring. The semiconductor devices of the present invention, which are intended to attain the foregoing objects, comprise a ceramic substrate provided with the first and second principal planes, a wiring pattern formed on said first principal plane and having mounted semiconductor components, an external electrode portion formed on said second principal plane and connected to an external circuit, internal layer wiring formed inside said ceramic substrate to electrically connect said wiring pattern and said external electrode portion via through-hole wiring, semiconductor components connected to said wiring pattern, and a resin layer for covering said first principal plane and said semiconductor components; wherein said internal layer wiring is characterized in that it is formed internally with respect to the side of said ceramic substrate with a clearance of at least 0.05 mm.

Also, it is preferable that the side of said external electrode portion be formed on essentially the same plane as the side of said ceramic substrate.

The semiconductor components here refer to semiconductor device base substances, such as integrated circuit (IC) element base substances and field-effect transistor (FET) element base substances, and chip components such as passive elements represented by chip resistors and capacitors. Also, the wiring boards used for the semiconductor devices of the present invention include a ceramic substrate and a board having a wiring pattern, an external electrode portion, through-hole wiring, and internal layer wiring, all of which are formed on or in the ceramic substrate. In addition, the wiring board composite body is a board assembly consisting of multiple wiring boards.

BRIEF DESCRIPTION OF THE DRAWINGS

FIGS. 11(a) to 11(p) are cross-sectional schematic diagrams illustrating the shape of the split section in the semiconductor device of the present invention.

DETAILED DESCRIPTION OF THE PREFERRED EMBODIMENT

Further details of the present invention will be described with reference to various exemplary embodiments. The present invention, however, is not limited by the embodiments described herein, and can be modified as appropriate.

(Embodiment 1)

Figure 1:
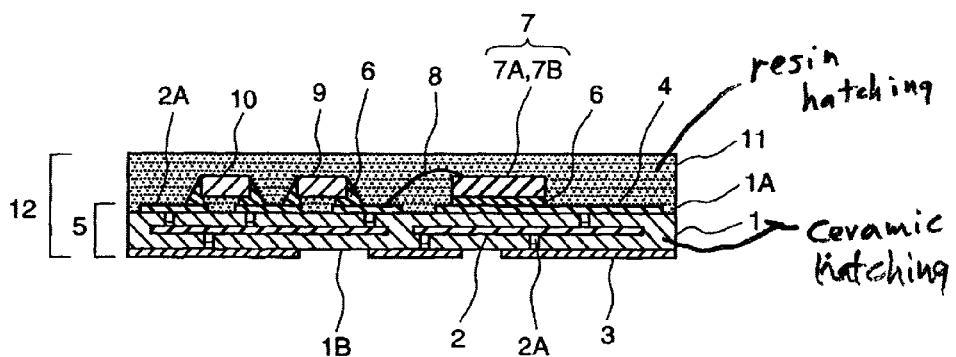
FIG. 1 is a cross-sectional view of the semiconductor device of the present invention.

A cross-sectional view of the semiconductor device 12 of the present invention, measuring 10.5 mm deep by 4.0 mm wide by 1.2 mm high, is shown in FIG. 1. Ceramic substrate 1 (insulating substrate) is made of a glass ceramic material having a thermal expansion coefficient of 6.2 ppm/° C., a heat conductivity of 2.5 W/m.K, a flexural strength of 0.25 GPa, a Young's modulus of 110 GPa, and a dielectric constant of 5.6 (1 MHz), and it measures 10.5 mm deep by 4.0 mm wide by 0.5 mm high. The first principal plane 1A of ceramic substrate 1 is provided with wiring pattern 4 (Ag-1 wt %Pt, 0.015 mm thick). The second principal plane 1B at the side opposite the first principal plane of ceramic substrate 1 is provided with external electrode portion 3 (Ag-1 wt %Pt, 0.015 mm thick). The sectional form of external electrode 3 in the semiconductor device of the present invention will be described in detail later. The inside of ceramic substrate 1 is provided with internal layer wiring 2 (Ag-1 wt %Pt, 0.015 mm thick) and through-hole wiring 2A (Ag-1 wt %Pt, 0.14 mm thick). Through-hole wiring 2A establishes electrical connections between wiring pattern 4 and internal layer wiring 2 and between internal layer wiring 2 and external electrode portion 3. Inside the ceramic substrate 1, internal layer wiring 2 is located 0.05 mm internally with respect to the side of the ceramic substrate. These components constitute one wiring board 5.

Semiconductor device base substance 7 (Si, 3.5 ppm/° C.), which comprises integrated circuit element base substance 7A (not shown in FIG. 1) and FET element base substance 7B (not shown in FIG. 1), and chip components consisting of two chip resistors 9 (approx. 7 ppm/° C.) and capacitor 10 Approx. 11.5 ppm/° C.) are electroconductively (or electrically) fixed to wiring pattern 4 of wiring board 5 via solder layers 6 each composed of Pb-10 wt %Sn-5 wt %Sb-1 wt %Ag (melting temperature: 238° C.). Semiconductor device base substance 7 has solder layer 6 formed at the bottom and is electroconductively fixed to the wiring pattern. Also, chip resistors 9 and capacitor 10 have a solder layer formed at both ends of the respective base substances, and they are electroconductively fixed to wiring pattern 4. In addition, metallic thin wire 8 made of Au is bonded to the required section between wiring pattern 4 and semiconductor device base substance 7, which is formed of more than 27 diametral microns and 50 diametral microns of integrated circuit element base substance 7A and FET element base substance 7B, respectively. Resin layer 11, whose principal constituent is epoxy resin, covers (seals) these chip components, the metallic thin wire 8, and the first principal plane 1A, to ensure shielding from outside air. The formation of resin layer 11 in this way makes it possible to prevent chemical contamination of wiring pattern 4 formed on the first principal plane 1A, and of the chip components mounted on wiring pattern 4, and thus to protect the internal circuits of the semiconductor device. Such formation also offers the advantages that it eliminates the necessity for worry about chemical contamination and that ease in handling improves. In addition, this scheme, compared with partial resin sealing, minimizes the local stresses applied to the boundary between the resin section and the principal plane section not sealed with resin.

Figure 2:
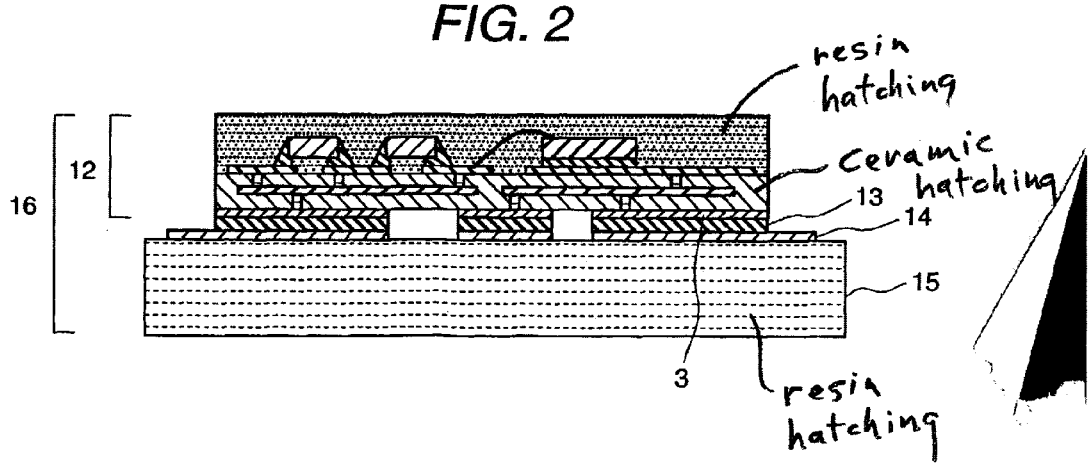
FIG. 2 is a cross-sectional view of the structural body of the present invention.

A cross-sectional view of the structural body 16 according to this embodiment is shown in FIG. 2. The structural body 16 of the present invention can be obtained by fixing electroconductively fixing the external electrode portion 3 of the abovementioned semiconductor device 12 and the external wiring 14 formed on one side of external wiring board 15, via external wiring connection layer 13. Wiring board 15 is made of a glass epoxy material having a thermal expansion coefficient of 14.0 ppm/° C. and a Young's modulus of 170 GPa and measuring 30.0 mm by 7.0 mm by 0.6 mm. Also, external wiring 14 is made of a Cu material 25 microns thick, and external wiring connection layer 13 is made of Pb-60 wt %Sn solder whose melting temperature is 183° C.

The primary important requirement here is that internal layer wiring 2 be formed inside ceramic substrate 1 at a distance of at least 0.05 mm internally with respect to the side of the ceramic substrate. In other words, internal layer wiring 2 must be completely surrounded by ceramic substrate 1 and the distance from the end of the internal layer wiring to the side of the ceramic substrate must be maintained at 0.05 mm or more so that the internal layer wiring is not exposed to the side of the ceramic substrate. Thus, separation between the internal layer wiring and the ceramic substrate can be prevented.

The secondary important requirement is that the side of external electrode portion 3 be formed on essentially the same plane as the side of ceramic substrate 1. In other words, external electrode portion 3 must have one part of its marginal area so arranged as to essentially overlap one part of the marginal area of the second principal plane. Thus, ceramic substrate 1 can be prevented from being damaged by cracks that result from the connections between the ceramic substrate and external electrode portion 3.

The primary and secondary important requirements described above for semiconductor device 12 and structural body 16 are necessary for the following reasons.

Semiconductor device 12 is mounted on external wiring board 15 by soldering. The heating process at this time applies a severe thermal stress to semiconductor device 12. If the primary and secondary important requirements mentioned above are not satisfied, separation occurs at the boundary of internal layer wiring 2 and ceramic substrate 1, and as the separation progresses, the internal layer wiring 2 itself suffers disconnections. This mechanism is described below.

Figure 3:
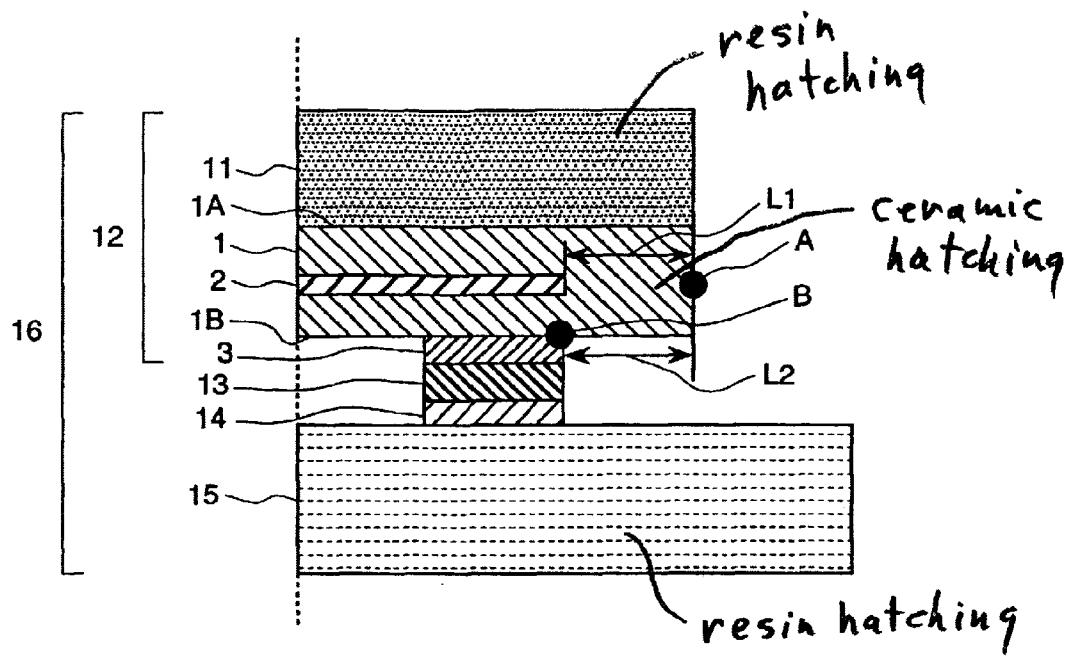
FIG. 3 is a cross-sectional view of a stress simulation model of the structural body of the present invention.

FIG. 3 is a cross-sectional view of a stress simulation model of the structural body. The dotted line in the figure denotes the center line of ceramic substrate 1 (0.5 mm thick). Semiconductor device 12 having epoxy-based 0.8 mm-thickness resin layer 11 formed on this ceramic substrate is mounted on external wiring board 15 (0.6 mm thick) via external wiring connection layer 13 (1.5 mm wide). Ceramic substrate 1 is made of a glass ceramic material, and external wiring board 15 is made of a glass epoxy material. The middle of ceramic substrate 1 is provided with Ag—Pt internal layer wiring 2 (0.015 mm thick). Those sides of the external wiring connections (soldered connections) that face ceramic substrate 1 and external wiring board 15 are provided with external electrode portion 3 (Ag—Pt, 0.015 mm thick) and external wiring 14 (Cu, 0.015 mm thick), respectively, and both are fixed via external wiring connection layer 13 (Pb-60 wt %Sn, 0.1 mm thick). The position of internal layer wiring 2 is denoted as distance L1 (mm) from the side of ceramic substrate 1 to the end of the internal layer wiring. Although FIG. 3 shows only the distance at one particular cross section, L1 is taken as the shortest distance from internal layer wiring 2 and the side of ceramic substrate 1. The position of external electrode portion 3 is denoted as distance L2 (mm) from the side of ceramic substrate 1 to the outer end of the external electrode portion. The stresses described below are represented as the maximum stress applied to section A on the side of ceramic substrate 1, and the stress applied to outer boundary section B between the ceramic substrate and Ag—Pt external electrode portion 3. The thickness direction and horizontal direction of structural body 16 are taken as a Z-axial direction and an X-axial direction, respectively. Data denoting the physical characteristics of the materials used for the simulation model is shown in Table 1.

TABLE 1

| | Young's modulus (GPA) | Poisson's ratio | Linear expansion coefficient (ppm/° C.) |
|---|---|---|---|
| Sealing resin | 25 | 0.30 | 9.0 |
| Glass Ceramic | 126 | 0.20 | 6.2 |
| Ag | 71 | 0.37 | 19.7 |
| Pb-60 wt % Sn | 29 | 0.27 | 22.5 |
| Glass epoxy substrate | 167 | 0.35 | 14.0 |

Figure 4:
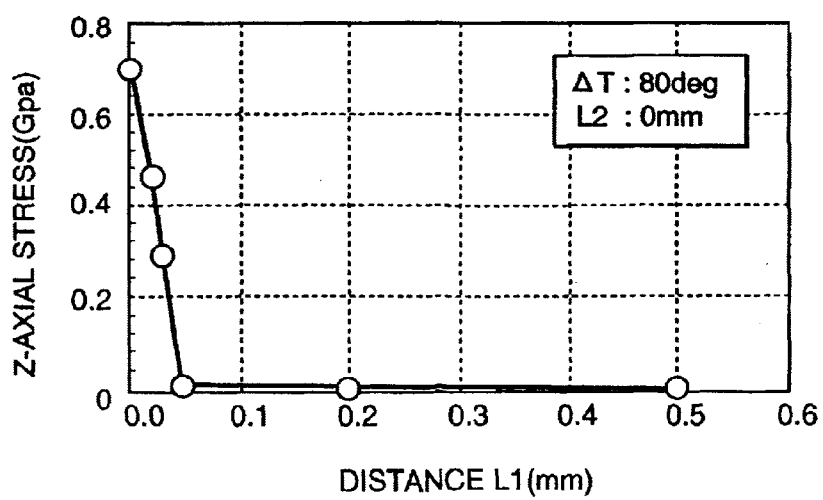
FIG. 4 is a graph showing the position dependency of internal layer wiring on the Z-axial stresses occurring on the side of a ceramic substrate.

FIG. 4 is a graph showing the position dependency of internal layer wiring 2 on the Z-axial stress occurring on the side of ceramic substrate 1 when a temperature change of $\Delta=80$ deg is applied to structural body 16, where $\Delta T$ denotes the temperature difference of $|T1-T2|$ that occurs when the temperature is changed from T1 to T2. Temperature changes from 70 to −10 deg C. for a $\Delta T$ value of 80 deg, from 100 to −30 deg C. for a $\Delta T$ value of 130 deg, and from 150 to −55 deg C. for a $\Delta T$ value of 205 deg, are applied in the embodiments of the present invention. Hereinafter, $\Delta T$ means the same. In this graph, L2 is fixed at 0 mm and only L1 is changed. The vertical axis of the graph denotes changes in the maximum stress (namely, the X-axial tensile stress) applied to the side (section A in FIG. 3) of ceramic substrate, associated with changes in the position of internal layer wiring 2. The Z-axial stress takes the greatest value when L1 becomes equal to 0 mm. As L1 is increased to 0.05 mm, the Z-axial stress value decreases abruptly, and when L1 is increased above 0.05 mm, the Z-axial stress value maintains a level almost close to zero. It is to be noted here that in the L1 range from 0.00 to 0.05 mm, the stresses occurring exceed 0.25 GPa, which is the critical fracture strength of the glass ceramic material, and that when L1 is greater than 0.05 mm, only stresses not exceeding the critical fracture strength of the glass ceramic material are exerted.

Figure 5:
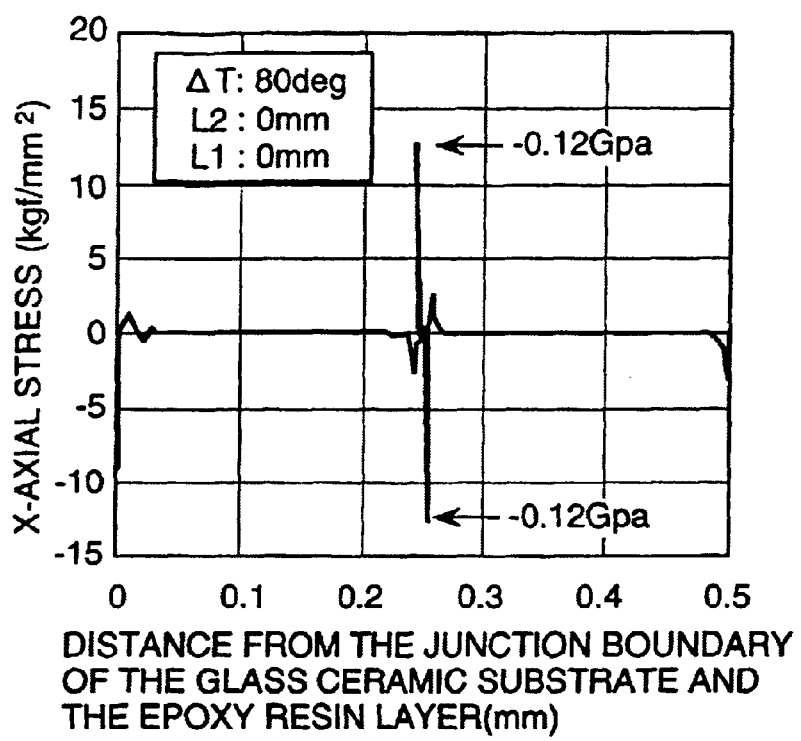
FIG. 5 is a graph showing the X-axial stresses occurring on the side of the ceramic substrate when temperature changes are applied to the structural body of the present invention.

FIG. 5 is a graph showing the X-axial stress occurring on the side of ceramic substrate 1 when a temperature change of $\Delta T=80$ deg is applied to structural body 16. In this graph as well, L2 is fixed at 0 mm and data is shown for the case of L1=0 mm. The X-axial stress here refers to the horizontal shear stress applied to structural body 16. The horizontal axis of the graph denotes changes in the distance from the junction boundary (first principal plane 1A) between ceramic substrate 1 and resin layer 11, to the junction boundary (second principal plane 1B) between ceramic substrate 1 and external electrode portion 3. Internal layer wiring 2 is exposed up to the surface of the side of ceramic substrate 1. The Z-axial stresses at the two boundaries between ceramic substrate 1 and internal layer wiring 2 take almost the same and large value. That is to say, tensile stresses occur at the boundary shorter in distance, and compressive stresses, at the boundary longer in distance, because changes from low temperatures to high temperatures are applied. When changes from low temperatures to high temperatures are applied, compressive stresses occur at the boundary shorter in distance and tensile stresses occur at the boundary longer in distance.

It is important here that when temperature changes are given to structural body 16, the following mechanism acts: the semiconductor device 12 of the structural body 16 is subject to convex warping deformation (when changes from high temperatures to low temperatures are applied), and the external wiring board 15 is subject to convex warping deformation (when changes from low temperatures to high temperatures are applied). Associated with these deformations, tensile stresses and compressive stresses are alternately exerted in the X-axial direction at the two boundaries between ceramic substrate 1 and internal layer wiring 2, as shown in FIG. 5. Ceramic substrate 1 and internal layer wiring 2 are not strongly bonded since both are simultaneously baked at a relatively low temperature of about 1,000 deg C. Therefore, if the bonding force at their boundaries is not great enough for them to withstand the above-mentioned tensile stresses or compressive stresses, separation originates from the boundary end (section A in FIG. 5) on the side of ceramic substrate 1. The separation area of the section thus separated will be progressively increased by the excessive Z-axial tensile stresses plotted in FIG. 4. During this process, not only will the separation interval (the interval between separated ceramic substrate 1 and internal layer wiring 2) increase, but also the deformation fatigue of the internal layer wiring itself is accumulated, with the result that the internal layer wiring is disconnected, causing deterioration or loss of the circuit functions of semiconductor device 12.

When L1 ranges from 0.00 to 0.05 mm, since stresses exceeding the critical fracture strength of ceramic substrate 1 also occur, disconnections on internal layer wiring 2 are caused by the mechanism described above.

Next, the case where L1 exceeds 0.05 mm will be described. In this case, X-axial stresses on the surface of the side of ceramic substrate 1 only occur with a very small value of 0.01 GPa in the sections corresponding to the two boundaries between the ceramic substrate and internal layer wiring 2. When changes from high temperatures to low temperatures are applied, tensile stresses occur at the boundary that is shorter in distance and compressive stresses occur at the boundary longer in distance. In this respect, the above case is the same as that shown in FIG. 5. When changes from low temperatures to high temperatures are applied, compressive stresses occur at the boundary that is shorter in distance and tensile stresses occur at the boundary longer in distance.

It is important here that when temperature changes are given to structural body 16, the following mechanism acts: the X-axial tensile shear stresses and compressive shear stresses occurring particularly at the surface of the side of ceramic substrate 1, associated with the warping deformations of structural body 16, are very insignificant and do not exceed the critical fracture strength of ceramic substrate 1. Therefore, such origin of separation that occurs when L1 ranges from 0.00 to 0.05 mm does not occur and the Z-axial tensile stresses on the surface of the side of ceramic substrate 1 do not exceed the critical fracture strength thereof, either. For these reasons, new separation or cracking does not occur, and accumulation of deformation fatigue of the internal layer wiring itself, resulting internal layer wiring disconnections, and consequential deterioration or loss of the circuit functions of semiconductor device 12 are avoided.

Figure 6:
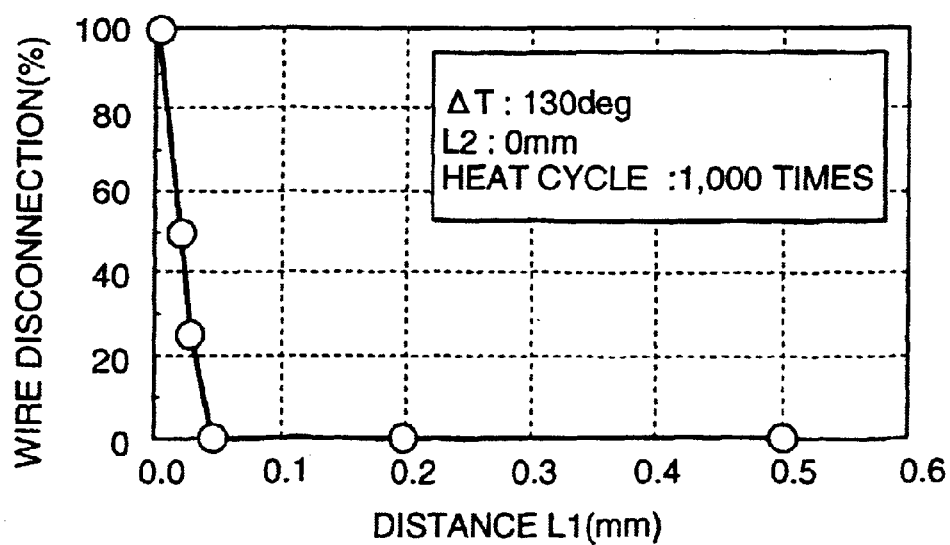
FIG. 6 is a graph showing the changes in wire disconnection ratio that will occur as a result of the effects of L1 when a heat cycle is repeatedly applied to the stuck body of the present invention.

Next, heat cycle test results for the structural body 16 that uses semiconductor device 12 of the present invention will be described. FIG. 6 shows changes in the wire disconnection ratio, based on the fact that internal layer wiring 2 or through-hole wiring 2A is fractured by the effects of L1. The wire disconnections in this case arise from the progress of the separation between ceramic substrate 1 and internal layer wiring 2, caused by the stress on section A. At this time, L2 is fixed at 0 mm. The wire disconnection ratio is 100% when L1 is 0 mm, and as L1 is increased, the wire disconnection ratio decreases and its value for an L1 value of 0.05 mm is 0%. During this process, the wire disconnection ratio depends greatly on L1 and undergoes abrupt changes. The wire disconnection ratio increases because fracture due to cracking along the internal layer wiring progresses. In the L1 region exceeding 0.05 mm, the wire disconnection ratio is maintained at a level of 0%. The characteristic factors when compared with the test results shown in FIG. 4 will be described. Firstly, in the L1 range from 0.00 to 0.05 mm and the stress range exceeding 0.25 GPa, which is the critical fracture strength of glass ceramic substrate 1, the wire disconnection ratio changes abruptly and takes a large value. Secondly, in the L1 range exceeding 0.05 mm, that is to say, in the region that only stresses not exceeding the critical fracture strength of glass ceramic substrate 1, the wire disconnection ratio is maintained at 0%. It can be understood from these results that before excellent reliability can be achieved, L1 needs to be greater than 0.05 mm.

The above is the mechanism that the internal layer wiring 2 itself suffers disconnections when the requirement of primary importance is not satisfied, and is the reason why the internal layer wiring 2 itself does not suffer disconnections when the requirement of primary importance is satisfied.

When the foregoing requirement of secondary importance is not satisfied, fracture due to the cracking that originates from the boundary (section B in FIG. 3) between the outer end of external electrode portion 3 and ceramic substrate 1 arises; and, as the resulting separation progresses, the internal layer wiring 2 itself suffers disconnections. This mechanism will be described below.

Figure 7:
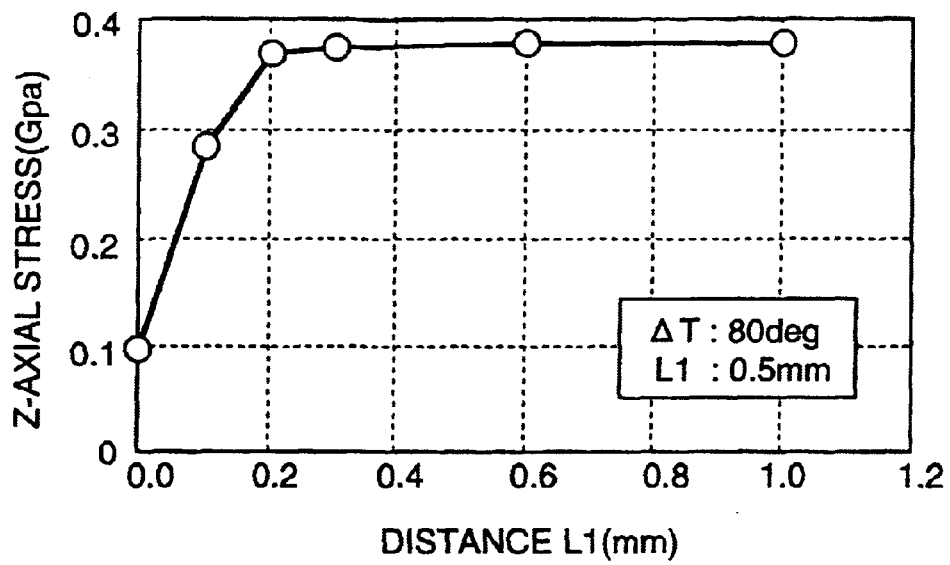
FIG. 7 is a graph showing the position dependency of an external electrode portion on the Z-axial stresses occurring at the boundary between the second principal plane of the ceramic substrate and the outer end of the external electrode portion when temperature changes are applied to the structural body of the present invention.

FIG. 7 is a graph showing the position dependency of external electrode portion 3 on the Z-axial stress occurring at the boundary between the second principal plane of ceramic substrate 1 and the outer end of the external electrode portion when a temperature change of ΔT=80 deg is applied to structural body 16. In this graph, L2 is fixed at 0.5 mm and only L2 is changed. The Z-axial stress on section B takes the smallest value when L2 becomes equal to 0.0 mm. As L2 is increased to 0.2 mm, the Z-axial stress value decreases abruptly, and when L2 is increased above 0.2 mm, the Z-axial stress value saturates. It is to be noted here that L2 must be controlled below 0.05 mm (preferably, 0.00 mm) so as to maintain a Z-axial stress smaller than the critical fracture strength (0.25 GPa) of the glass ceramic material used for ceramic substrate 1. Provided that this requirement is satisfied, the Z-axial stress on section B does not exceed the critical fracture strength of the glass ceramic material, nor do any new fracture-causing cracks occur that originate from section B. Internal layer wiring 2 or through-hole wiring 2A embedded in ceramic substrate 1, therefore, is not fractured or disconnected by cracking. If L2 exceeds 0.05 mm, however, the Z-axial stress on section B will exceed the critical fracture strength of the glass ceramic material, thus resulting in fracture due to new cracks that originate from section B. As the fracture progresses, the leading end of the cracking will reach embedded internal layer wiring 2 and/or through-hole wiring 2A, and the resulting increase in the interval between ceramic substrate 1 and internal layer wiring 2 will accumulate the deformation fatigue of the internal layer wiring itself and eventually result in the disconnection thereof and the consequential deterioration or loss of the circuit functions of semiconductor device 12.

Figure 8:
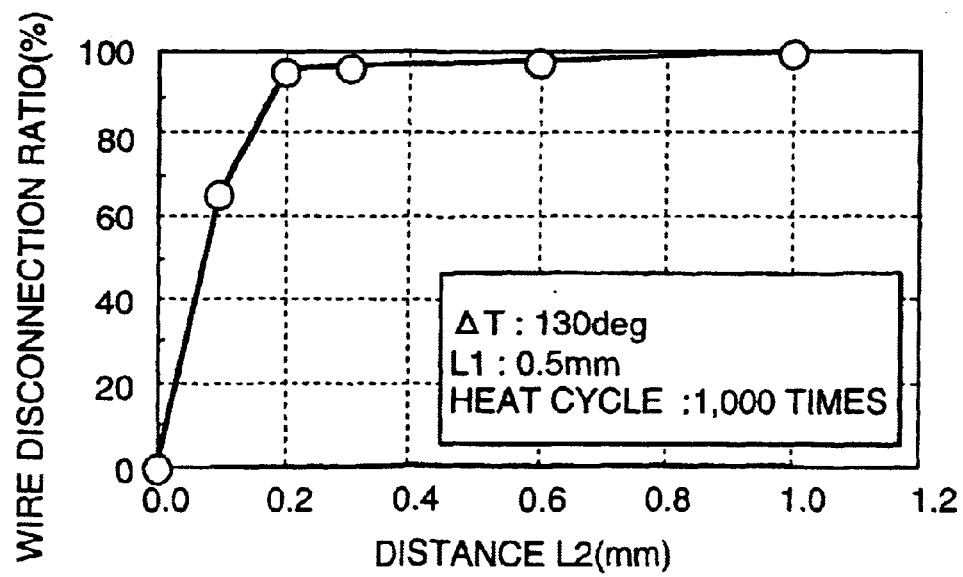
FIG. 8 is a graph showing the changes in wire disconnection ratio that will occur as a result of the effects of L2 when a heat cycle is repeatedly applied to the structural body of the present invention.

FIG. 8 shows changes in the wire disconnection ratio, based on the fact that, when a heat cycle of ΔT=130 deg is applied to structural body 16 one thousand times, internal layer wiring 2 or through-hole wiring 2A will be fractured by the effects of L1. The wire disconnections in this case arise from the progress of the cracking at the connections between ceramic substrate 1 and external electrode portion 3, caused by the stress on section B. At this time, L1 is fixed at 0.5 mm. The wire disconnection ratio is 0% when L2 is 0 mm, and, as L1 is increased, the wire disconnection ratio also increases and its value for an L2 value of 0.2 mm is 90%. During this process, the wire disconnection ratio depends greatly on L2 and undergoes abrupt changes. In the L2 range above 0.2 mm, the wire disconnection ratio progressively increases and takes great values. These increases in the wire disconnection ratio are caused by the cracking of ceramic substrate 1 that has originated from the outer end of external electrode portion 3, namely, section B shown in FIG. 3, and, as the cracking progresses, internal layer wiring 2 and through-hole wiring 2A suffers damage. The characteristic factors when compared with the test results shown in FIG. 7 will be described below. Firstly, in the case of L2=0 mm that does not allow the stress on section B to exceed the critical fracture strength of the glass ceramic material, the wire disconnection ratio is maintained at 0%. Secondly, the wire disconnection ratio for an L2 value of 0.05 mm is about 20% and the test condition in this case is ΔT=130 deg. The reliability that structural body 16 is estimated to achieve with the above taken into consideration is high enough relative to the level required (ΔT=80 deg, 500 times). In other words, it is possible to control the stress below the critical fracture strength of the glass ceramic material. When L2 is less than 0.05 mm, a reliability high enough for practical use is bestowed on semiconductor device 12 and on structural body 16.

The above is the mechanism by which the internal layer wiring 2 itself suffers disconnections when the requirement of secondary importance is not satisfied, and is the reason why the internal layer wiring 2 itself does not suffer disconnections when the requirement of secondary importance is satisfied.

Since semiconductor device 12 described in this embodiment satisfies the foregoing requirement of primary importance, the strength against cracking-caused fracture cracks near internal layer wiring 2 (that is to say, small stresses on section A shown in FIG. 3) is bestowed on unit 12 as shown in FIG. 4. Therefore, as shown in FIG. 6, excellent strength against disconnections is also assigned to internal layer wiring 2 and through-hole wiring 2A.

Since the semiconductor device 12 according to this embodiment also satisfies the foregoing requirement of secondary importance, the strength against cracking-caused fracture near external electrode portion 3 (that is to say, small stresses on section B shown in FIG. 3) is bestowed on unit 12 as shown in FIG. 6. Therefore, as shown in FIG. 8, the strength against cracking-caused fracture is bestowed on ceramic substrate 1, with the result that excellent strength against disconnections is also assigned to internal layer wiring 2 and through-hole wiring 2A.

Figure 9A:
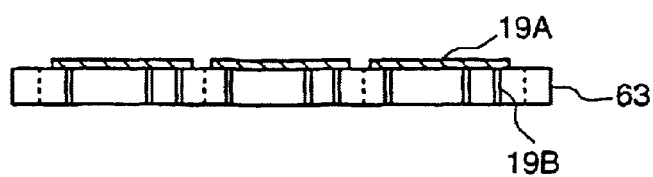
FIGS. 9(a) to 9(e) are diagrams illustrating processes for manufacturing the wiring board composite body applied to the semiconductor device of the present invention.

Next, the manufacturing processes for the structural body according to this embodiment will be described. FIGS. 9(a) to 9(e) illustrate the manufacturing processes for wiring board composite body 5A applied to the semiconductor device of this embodiment as cross-sectional views of the ceramic substrate. First, a cross-sectional view of the #1 green sheet is shown in FIG. 9(a). The #1 green sheet 63 is made of a mixture of a glass ceramic material and an organic material. This sheet, after being baked, is conditioned so as to be 78.80 mm by 75.00 mm in surface area and 0.25 mm in thickness. A through-hole is formed in the required portion of the #1 green sheet 63. This through-hole is charged with paste 19B that has been conditioned to obtain an after-baking composition of Ag-1 wt %Pt. Paste layer 19A for the formation of wiring pattern 4 is created by silkscreen printing.

Figure 9B:
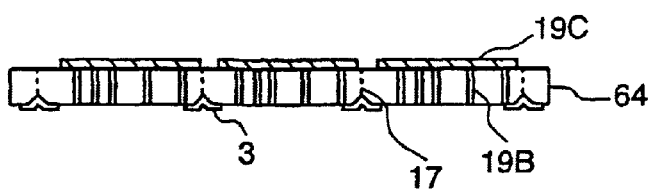
Figure 9C:
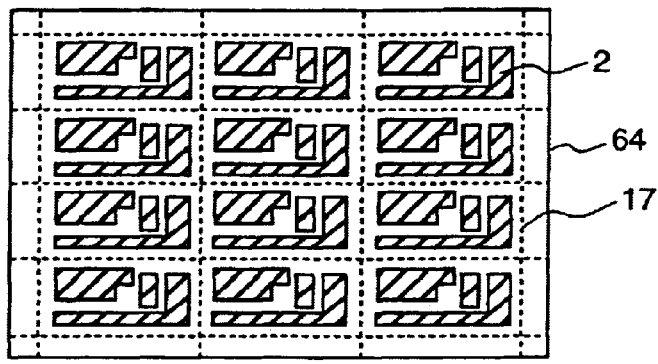
Figure 9D:
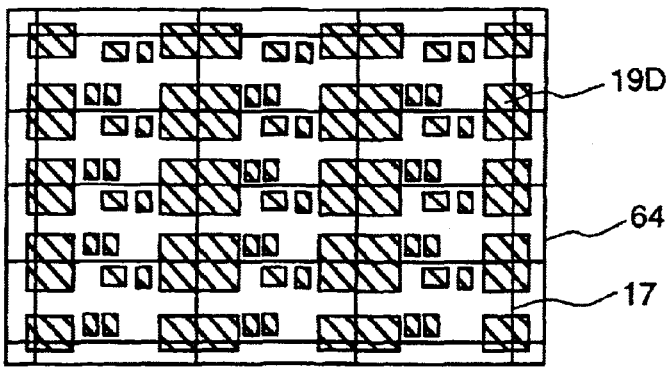

Next a cross-sectional view of the #2 green sheet is shown in FIG. 9(b). The #2 green sheet 64 is also made of materials similar to those of the #1 green sheet 63 and has a through-hole formed in the required portion. Similarly, this through-hole is charged with paste 19B. For wiring reasons, the position of this through-hole differs from that of the through-hole provided in the #1 green sheet 63. Also, the reverse side of the #2 green sheet 64 is provided with break line (groove) 17 beforehand. This break line is provided for the splitting of wiring board composite body 5A in the immediately succeeding process, and determines the size (or sectioning) of semiconductor device 12. The sectioning enables 102 effective areas to be obtained. As shown in plan view in FIG. 9(c), green sheet 64 is silkscreen-print patterned with paste layer 19C for the formation of internal layer wiring 2 on the surface of the first principal plane side. It is desirable for internal layer wiring 2 to be formed so as to stay within the section consisting of break line 17 provided on the opposite side to the second principal plane 1B of ceramic substrate 1, and that patterning be provided to ensure a distance more than 0.05 mm from the end of internal layer wiring 2 to the side of the substrate. In this embodiment, patterning is provided to ensure a distance of 0.50 mm.

Figure 9E:
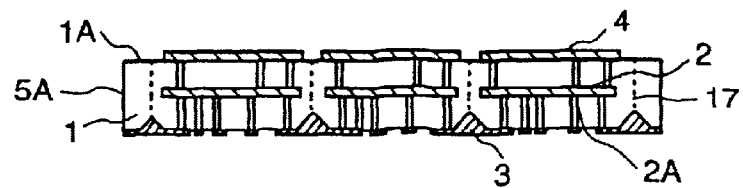

Next, the above-mentioned #1 and #2 green sheets 63 and 64 are laminated and then heated to 1,000 deg C., and after this, the glass ceramic material and pastes 19A, 19B, and 19C are baked at the same time. After having undergone these processes, green sheets 63 and 64 are bonded to one another to form a highly rigid sintered body. Next, as shown in plan view in FIG. 9(d), paste layer 19D that has been conditioned to obtain an after-sintering composition of Ag-1 wt %Pt is applied to green sheet 64 on the opposite side (the second principal plane 1B) by silkscreen-print patterning, and then baking in air at a temperature of 850 deg C. is provided to form external electrode portion 3. When external electrode portion 3 is formed in this way, after wiring board composite body 5A has been split, the side of the external electrode portion is essentially the same plane as the side of the ceramic substrate. It is thus possible to prevent cracks from occurring at the connections between the ceramic substrate and the external electrode portion. These processes are performed to obtain wiring board composite body 5A. A cross-sectional view of the wiring board composite body 5A that has thus been obtained is shown in FIG. 9(e). Wiring pattern 4 that has been formed on the first principal plane 1A, external electrode portion 3 that has been formed on the second principal plane 1B, and internal layer wiring 2 and through-hole wiring 2A that have been formed inside ceramic substrate 1 are provided in the multiple sections of the ceramic substrate sectioned by groove 17 formed on the second principal plane 1B. These required sections are electrically connected. In this case, external electrode portion 3 is formed so that it covers one part of the groove. After being baked, ceramic substrate 1 is conditioned so as to be 78.8 mm by 75.0 mm in surface area and 0.5 mm in thickness. The wiring board composite body 5A that has been obtained through the above processes has the following performance: 6.2 ppm/° C. in thermal expansion coefficient, 2.5 W/m.k in heat conductivity, 0.25 GPa in flexural strength, 110 GPa in Young's modulus, and 5.6 (1 MHz) in dielectric constant.

Figure 10A:
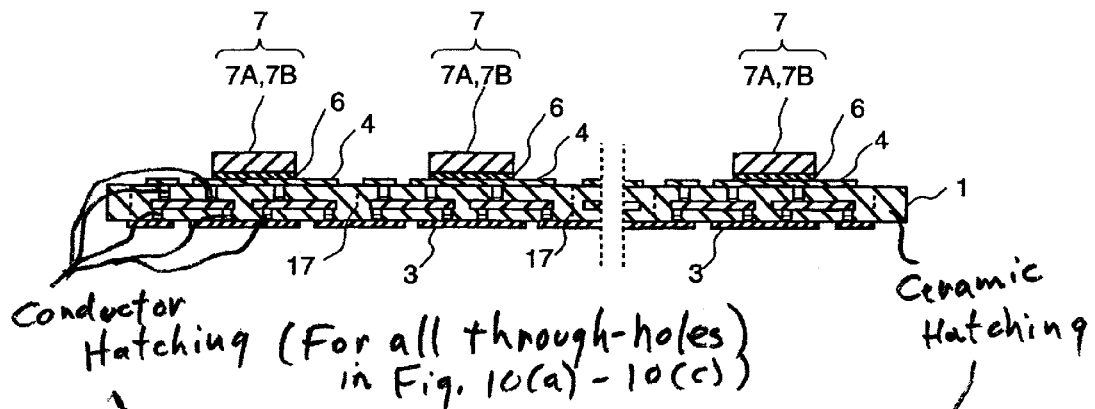
FIGS. 10(a) to 10(c) are diagrams illustrating processes for manufacturing the semiconductor device of the present invention.
Figure 10B:
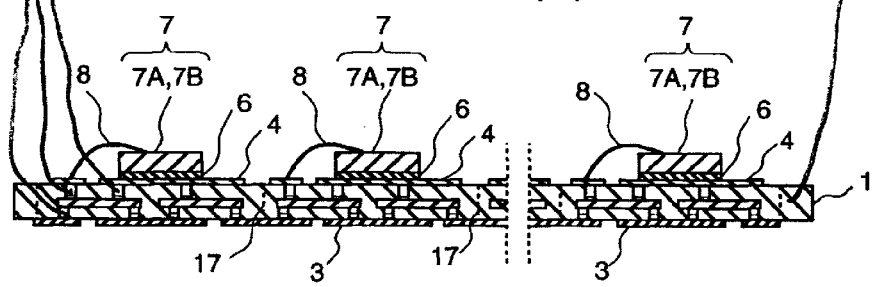
Figure 10C:
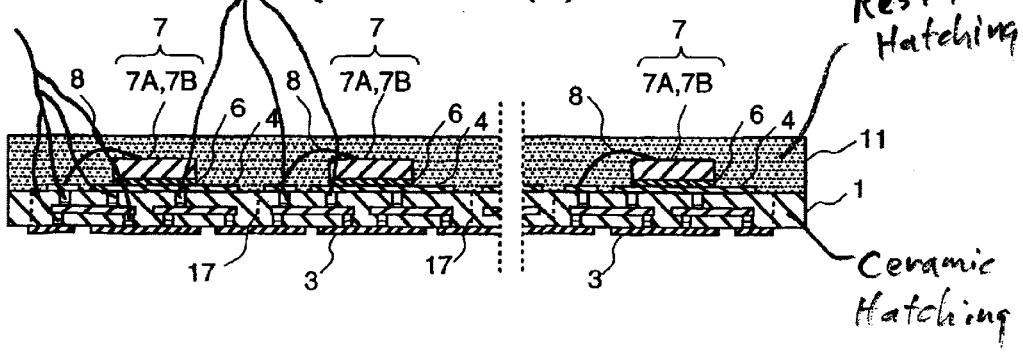

FIGS. 10(a) to 10(c) are is a cross-sectional views showing subsequent semiconductor device manufacturing processes. Semiconductor device base substance 7, which comprises integrated circuit element base substance 7A and FET (element base substance 7B), and chip components consisting of chip resistors 9 and capacitor 10 are electroconductively fixed to wiring pattern 4 of wiring board composite body 5A via solder layers 6 each composed of Pb-10 wt %Sn-5 wt %Sb-1 wt %Ag. In this process, a paste that has been conditioned to obtain an after-soldering composition of Pb-10 wt %Sn-5 wt %Sb-1 wt %Ag is printed onto the required portion of wiring pattern 4. Next, chip components are set on the paste, which is then heated to 265 deg C. in air. Through this process, the chip components are electroconductively fixed to wiring pattern 4 of wiring board composite body 5A, as shown in FIG. 10(a). Next, as shown in FIG. 10(b), metallic thin wire 8 made of Au is thermocompression-bonded to the required section between semiconductor device base substance 7 and wiring pattern 4 under an atmosphere of 200 deg C. (integrated circuit element base substance 7A: 27 microns in diameter, FET element base substance 7B: 50 microns in diameter). After the manufacturing processes have pressed to this phase, resin layer 11, whose principal constituent is epoxy resin, is printed in all the sectioned effective areas of wiring board composite body 5A so that the chip components, metallic thin wire 8, and the first principal plane 1A are fully covered. The printed epoxy resin is cured by being heated in air to 110 deg C. for 1.5 h first and then 150 deg C. for 1.5 h, with the result that resin layer 11 is formed. Resin layer 11 uses a material assuming the following physical properties after being cured: 9.0 ppm/° C. in thermal expansion coefficient, 24.5 GPa in Young's modulus, 150 deg C. in glass transition temperature, and 85 wt % in the amount of filler addition After these processes have been performed, resin layer 11 seals the chip components, metallic thin wire 8, and the first principal plane 1A so that as shown in the cross-sectional view in FIG. 10(*c*), these three portions are completely shielded from outside air. Next, when external force is applied, resin-molded wiring board composite body 5A will be split along break line 17. At this time, ceramic substrate 1 and resin layer 11 will be fractured so as to have the respective fractured sides of the form belonging to essentially the same plane. These fractures will, in turn, result in external electrode portion 3 being fractured and its fractured side will also take the form belonging to essentially the same plane as the fractured sides of ceramic substrate 1 and resin layer 11.

Semiconductor device 12 shown in FIG. 1 is obtained through the above processes. During the multiple-cavity molding of wiring board composite body 5A that leads to individual splitting, the use of the above processes enables each wiring board composite body 5A to be provided with chip component mounting and resin molding. Accordingly, the mass productivity of semiconductor device 12 is enhanced and economical merits are also augmented. Also, although this embodiment applies to internal layer wiring made of one layer, even higher mounting density can be obtained by using two or more layers in internal layer wiring.

In the above individual splitting processes, it is desirable that ceramic substrate 1, resin layer 11, and external electrode portion 3 should ideally have the respective fractured sides of the form belonging to essentially the same plane. Fracture due to the application of external force, however, makes it difficult to obtain fractured sides as flat as those created by cutting with a rotary blade. Nevertheless, the fractured status of the form described below makes it possible to obtain anti-cracking fracture or anti-disconnection performance equivalent to those of FIG. 6.

Since semiconductor device 12 satisfies the foregoing requirement of primary importance, strength against cracking-caused fracture near internal layer wiring 2 is bestowed on unit 12 as shown in FIG. 4. Therefore, as shown in FIG. 6, strength against cracking-caused fracture is also bestowed on the ceramic substrate; and, as a result, excellent strength against disconnections is assigned to internal layer wiring 2 and through-hole wiring 2A.

FIGS. 11(*a*) to 11(*p*) are cross-sectional schematic views illustrating the shape of the split portion of the semiconductor device according to this embodiment. Chip components, internal layer wiring, through-hole wiring, wiring patterns, and solder layers are omitted from these cross-sectional schematic views. External electrode portion 3 is formed via paste printing and baking processes in such a manner that one part of the break line 17 in ceramic substrate 1 is covered. If the amount of paste printing is not sufficient, therefore, after splitting, traces of a groove similar to normal break line 17 will be left at the split corners of external electrode portion 3. Conversely, if a sufficient amount of paste is printed, the groove created by break line 17 will be filled in and traces of a groove similar to normal break line 17 will not be left at the split corners of external electrode portion 3 after splitting. An ideal splitting method for the semiconductor device 12 of the present invention involves the step of applying external force and generating a fracture along break line 17. At this time, when ideal splitting is executed, as shown in FIG. 11(*a*) or FIG. 11(*b*), the fractured side of external electrode portion 3 will take the form belonging to the same plane as the fractured side of resin layer 11. If external force is not ideally exerted during splitting, fractured sides of the various forms shown in FIG. 11(*c*) to FIG. 11(*p*) will be formed. FIG. 11(*c*) shows the case in which the external electrode portion 3 has a fractured end protruding from the split surface between ceramic substrate and resin layer 11, and FIG. 11(*d*) shows the case in which, conversely, external electrode portion 3 has a fractured end recessed from the split surface between ceramic substrate 1 and resin layer 11. In accordance with the present invention, there is the possibility of external electrode portion 3 taking various forms in addition to those shown in FIG. 11(*a*) to FIG. 11(*d*). In this case, even when external electrode portion 3 has a fractured end protruding or recessed from the split surface between ceramic substrate 1 and resin layer 11, provided that the distance of protrusion or recessing is less than 0.2 mm, the form of external electrode portion 3 is regarded as belonging to essentially the same plane as the fractured sides of ceramic substrate 1 and resin layer 11.

Figure 12:
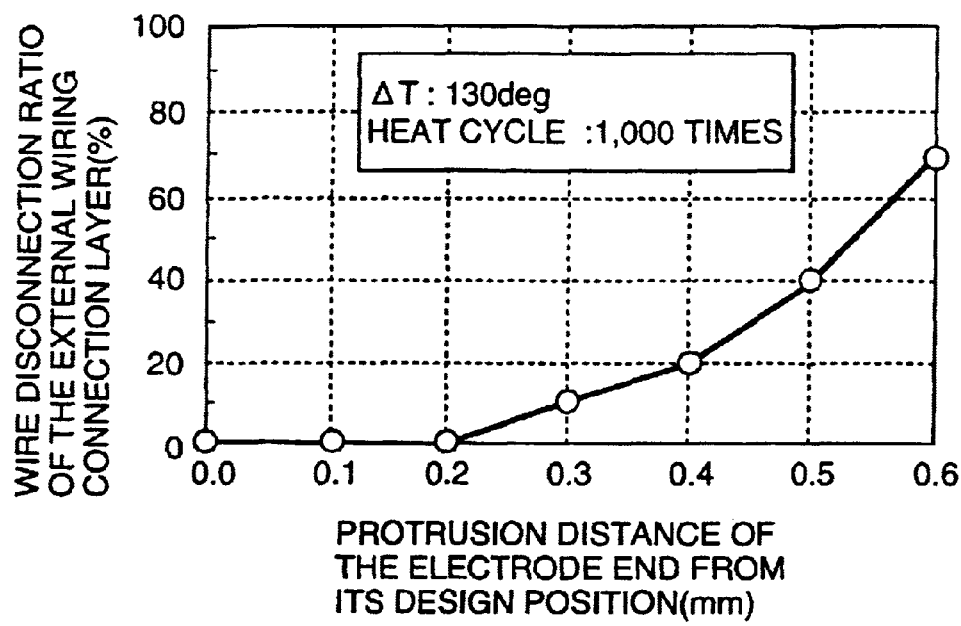
FIG. 12 is a graph showing heat cycle test results on the structural body of the present invention.

The reason for this will be explained below with reference to the figures. The relationship between the distance from the fracture end of external electrode portion 3 to the design position, and the wire disconnection ratio of the external wiring connection layer is shown in FIG. 12. The wire disconnection ratio, although maintained at 0% for protrusion distances of electrode ends up to 0.2 mm, increases when 0.2 mm is exceeded. This is considered to be due to the fact that mismatching in position between external electrode portion 3 and external wiring 14 causes external wiring connection layer 13 (solder) to take a cracking-prone shape. When the side of external electrode portion 3 is formed on essentially the same plane as the side of ceramic substrate 1 the outer end of the external electrode side abutting on ceramic substrate 1 protrudes in the direction of the first principal plane shown in FIG. 1. Also, ceramic substrate 1 has a taper at the at the end of the second principal plane shown in FIG. 1, and external electrode portion 3 is so formed as to cover one part of the taper mentioned above and one part of the second principal plane shown in FIG. 1. The shapes of the fractured sides of external electrode portion 3, ceramic substrate 1, and resin layer 11 can be confirmed by observation using a microscope with a magnifying power of about ×70.

In FIG. 11(*e*) to FIG. 11(*p*), groove 17 is omitted. In FIG. 11(*e*) to FIG. 11(*p*), ceramic substrate 1 is shown in obliquely fractured form and resin layer 11 is shown in linearly fractured form. These forms include the forms where the fractured side of ceramic substrate 1 is obliquely recessed or protruding with respect to the fractured side of resin layer 11, as shown in FIG. 11(*e*) or FIG. 11(*g*), respectively, and the forms where the fractured side of ceramic substrate 1 is stepwise protruding or recessed with respect to the fractured side of resin layer 11, as shown in FIG. 11(*f*) or 11(*h*), respectively.

In FIGS. 11(*i*) to 11(*l*), ceramic substrate 1 is shown in linearly fractured form and resin layer 11 is shown in obliquely fractured form. These forms include the forms where the fractured side of resin layer 11 is obliquely protruding or recessed with respect to the fractured side of ceramic substrate 1, as shown in FIG. 11(*i*) or 11(*k*), respectively, and the forms where the fractured side of resin layer 11 is stepwise recessed or protruding with respect to the fractured side of ceramic substrate 1, as shown in FIG. 11(*j*) or 11(*l*), respectively.

In FIGS. 11(m) to 11(p), ceramic substrate 1 is shown in obliquely fractured form and resin layer 11 is also shown in obliquely fractured form. These forms include the forms where the bonded sides of ceramic substrate 1 and resin layer 11 are fractured in convex or concave form, as shown in FIG. 11(m) or 11(n), respectively, the forms where the fractured sides of ceramic substrate 1 and resin layer 11 are both recessed, as shown in FIG. 11(o), compared with the cases of ideal splitting, as shown in FIGS. 11(a) and 11(b), and the forms where the fractured sides of ceramic substrate 1 and resin layer 11 are both protruding, as shown in FIG. 11(p), compared with the cases of ideal splitting, as shown in FIGS. 11(a) and 11(b).

Figure 13:
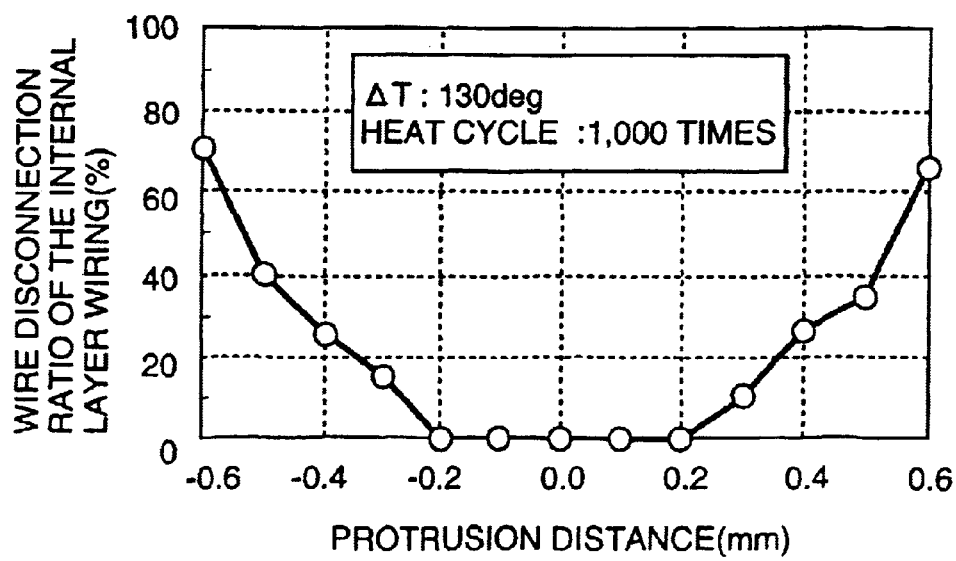
FIG. 13 is a graph showing heat cycle test results on the structural body of the present invention.

FIG. 13 is a graph which shows investigation results on the ratio of disconnection of the internal layer wiring due to the effects of the protrusion distance in the case where the fractured side of ceramic substrate 1 or resin layer 11 protrudes from an ideal split side. The protrusion distance here refers to the distance from an ideal split side to the actual fractured side of ceramic substrate 1 or resin layer 11. The wire disconnection ratio is 0% within the protrusion distance range of ±0.2 mm.

Even when, compared with their ideally split ones as shown in FIGS. 11(a) and 11(b), the above-described fractured sides, which are shown in FIGS. 11 (e) to 11(p), are protruding or recessed, the effectiveness of the present invention can be essentially obtained, provided that, as shown in FIG. 13, the protrusion distance or recess distance is less than 0.2 mm. When the fractured side of resin layer 11 is less than 0.2 mm in terms of protrusion distance or recess distance, the wire disconnection ratio is 0% because, provided that the fractured side of resin layer 11 is less than 0.2 mm in terms of protrusion distance or recess distance, the strength of ceramic substrate 1 against cracking-caused fracture near external electrode portion 3 and strength against cracking-caused fracture near internal layer wiring 2 are equivalent to the strength levels achievable under such ideal forms as shown in FIGS. 11(a) and 11(b).

Figure 14:
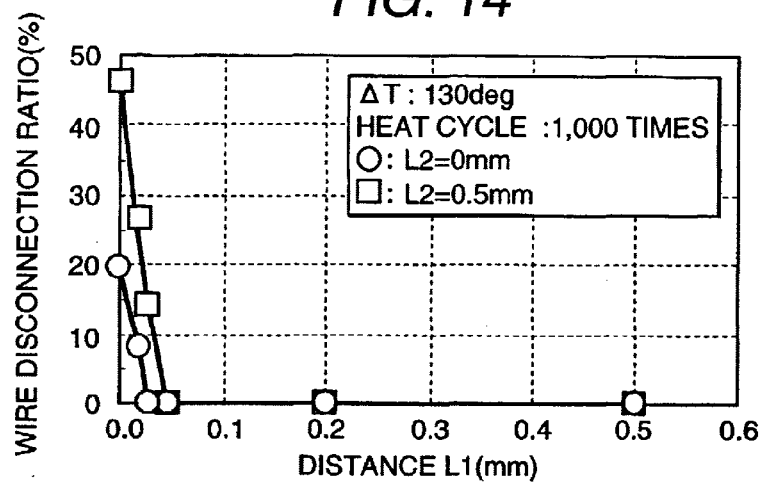
FIG. 14 is a graph showing the changes in wire disconnection ratio that will occur as a result of the effects of L1 when a heat cycle is repeatedly applied to the semiconductor device of the present invention.

FIG. 14 is a graph which shows the results that were obtained when a heat cycle of ΔT=205 deg was conducted 2,000 times for wire disconnection ratios with the various settings of distance L1 in semiconductor device 12. The wire disconnections in this case arise from the progress of the separation between ceramic substrate 1 and internal layer wiring 2 due to the stress on section A shown in FIG. 3. In FIG. 14, L2 is set to 0.0 mm and 0.5 mm. When L2 is 0.5 mm, the wire disconnection ratio becomes a maximum for an L1 value of 0.0 mm. As L1 is increased, the wire disconnection ratio decrees and its value for an L1 value of 0.05 mm is 0%. The wire disconnection ratio is also 0% in the L1 range exceeding 0.05 mm. When L2 is 0.0 mm, the wire disconnection ratio decreases below that which was obtained when L2 is 0.5 mm, and the wire disconnection ratio is 0% in the L1 range not exceeding 0.05 mm. For the semiconductor device of the present invention, therefore, it is preferable that L1 and L2 be set to more than 0.05 mm, and 0.0 mm, respectively, and provided that the requirement of primary importance and the requirement of secondary importance are satisfied, the effectiveness of wire disconnection prevention can be further improved. It can be seen from these results that, when a heat cycle is applied to semiconductor device 12, provided that L1 stays within the range of the present invention, the wire disconnection ratio is maintained at 0% and high reliability is ensured.

Semiconductor device 12, that has been obtained through the above processes, is mounted on external wiring board 15 and applied to a structural body 16 of the present invention such as shown in FIG. 2. External wiring 14, provided on one side of external wiring board 15 and made of a Cu material 25 microns thick, and external electrode portion 3 of semiconductor device 12 are electroconductively fixed via external wiring connection layer 13 to obtain structural body 16. External wiring connection layer 13 is made of a Pb-60 wt %Sn solder material whose melting temperature is 183 deg C. External wiring board 15 is made of a 30.0 mm×7.0 mm×0.6 mm glass epoxy material (a composite material consisting of epoxy resin and a glass fiber cloth impregnated therewith, and having a thermal expansion coefficient of 9.0 ppm/° C. and a Young's modulus of 35 GPa). It is preferable that the reverse side of this external wiring board 15 should be provided with a wiring pattern for further connection to external circuits, and that the wiring pattern on the reverse side and the wiring pattern for mounting semiconductor device 12 should be electrically connected. Also, the external wiring 14, although provided on one side of external wiring board 15, can be electrically connected to the opposite principal side via through-hole wiring. In addition, an even higher wiring density can be achieved by providing the interior of external wiring board 15 with more than one layer of internal layer wiring.

Structural body 16 satisfies the requirements of primary importance and secondary importance. As shown in FIGS. 6 and 8, therefore, the wire disconnection ratio is reduced to 0%, and high reliability is ensured, since structural body 16 is free from crack-caused fracture of the ceramic substrate in the semiconductor device during not only its mounting on the external wiring board, but also during repeated temperature changes associated with the starts and stops of the semiconductor device.

Instead of the materials heretofore mentioned in this embodiment, the materials described below can be used for the structural body 16 of the present invention.

In addition to A—Pt based materials, other thick-film materials can be used as the base materials for internal layer wiring 2, through-hole wiring 2A, external electrode portion 3, and wiring pattern 4. That is to say, a material can be used that consists of at least one type of metal selected from: Ag ($\Omega$162.cm in resistivity and 962 deg C. in melting temperature), Pt (1,060 $\Omega$.cm in resistivity and 1,772 deg C. in melting temperature), Cu (172 $\Omega$.cm in resistivity and 1,084 deg C. in melting temperature), Pd (1,080 $\Omega$.cm in resistivity and 1,554 deg C. in melting temperature), and Au (240 $\Omega$.cm in resistivity and 1,064 deg C. in melting temperature). For example, a thick-film material composed of Cu (approx. 100 wt %) and Ag-15 wt %Pd, can be a suitable wiring material. In such a case, the formation of a nickel or gold layer on that surface of a thick-film material consisting of at least one type of metal selected from the group of Ag, Pt, Cu, Pd, and Au, that has been formed as the wiring layer for external electrode portion 3 or wiring pattern 4, for example, is preferable for maintaining thick-film material surface quality, ensuring solder wettability, preventing erosion caused by the use of solder, and preventing the creation of intermetallic compounds at a soldered interface. Dispersion of a metallic powder material small in thermal expansion coefficient, such as an Fe-36 wt %Ni alloy (thermal expansion coefficient: 1.5 ppm/° C.), over a thick-film material consisting of at least one type of metal selected from the group of Ag (thermal expansion coefficient: 20.5 ppm/° C.), Pt (thermal expansion coefficient: 8.9 ppm/° C.), Cu (thermal expansion coefficient: 16.7 ppm/° C.), Pd (thermal expansion coefficient: 11.0 ppm/° C.), and Au (thermal expansion coefficient: 14.0 ppm/° C.), is also preferable. Alternatives for Fe—Ni based alloys include metals such as an Fe-31 wt %Ni-15 wt %Co based alloy (thermal expansion coefficient: 5.0 ppm/° C.), W, and Mo.

In addition, it is preferable that a thick-film material lower in wiring resistance, easier to bake, and higher in resistance to erosion by solder, should be selected A 0.2 wt %-1.5 wt %Ag-containing Pt material, in particular, has a low wiring resistance (sheet resistance) value of about 3 mΩ/□ and can be easily baked simultaneously with a glass ceramic material at about 1,000 deg C. Also, when a 0.2 wt %-1.5 wt %Ag-containing Pt material is used, even if chip components are fixed using an Sn-3.5 wt %Ag material (melting temperature: 221 deg C.) or other molten solder materials heavily laden with Sn, there will occur almost no erosion by the molten solder materials. Problems associated with erosion, therefore, can be avoided by using a solder material that contains less Sn than the above materials.

Ceramic substrate 1 can use, for example, a glass ceramic material whose characteristics are 12.2 ppm/° C. in thermal expansion coefficient, 2.0 W/m.k in heat conductivity, 2.0 GPa in flexural strength, 110 GPa in Young's modulus, and 5.4 (1 MHz) in dielectric constant. The types of materials which can be used for ceramic substrate 1 are not limited to glass ceramic materials; it is possible to use, by way of example, a Cu-wired alumina substrate 7.0 ppm/° C. in terms of thermal expansion coefficient, 15.2 W/m.k in terms of heat conductivity, 0.4 GPa in terms of flexural strength, 300 GPa in terms of Young's modulus, and 4 mΩ/□ in terms of wiring resistance (sheet resistance), or to use an alumina substrate whose characteristics are 12.2 ppm/° C. in thermal expansion coefficient, 2.0 W/m.k in heat conductivity, 2.0 GPa in flexural strength, 110 GPa in Young's modulus, and 5.4 (1 MHz) in dielectric constant. Or, a thick-film material consisting of at least one type of metal selected from the group of Ag, Pt, Cu, Pd, and Au can be used, instead of the above-mentioned wiring made of Cu. Or boron nitride (thermal expansion coefficient 0.59 ppm/° C., heat conductivity: 315 W/m.k), aluminum nitride (thermal expansion coefficient. 4.30 ppm/° C., heat conductivity: 140 W/m.k), or $NaO-ZnO-B_2O_3-SiO_2$ glass (thermal expansion coefficient: 21.00 ppm/° C., heat conductivity: 1.5 W/m.k) can be used. The use of these base materials ranging from 0.59 to 21.00 ppm/° C. in thermal expansion coefficient enables the reduction of the stresses occurring during sintering, because of insignificant differences in thermal expansion coefficient from thick-film materials consisting of the metal(s) selected from the group of Ag, Pt, Cu, Pd, and Au.

The usable glass ceramic materials include (1) an $Al_2O_3$-$2MgO.SiO_2$—($B_2O_3$—$SiO_2$) based material [composition: $Al_2O_3$ (35 wt %), $2MgO.SiO_2$ (25 wt %), $B_2O_3$—$SiO_2$ glass (40 wt %)], (2) an $Al_2O_3$—($CaO$—$Al_2O_3$—$SiO_2$—$B_2O_3$) based material [composition: $Al_2O_3$ (40 wt %), $CaO$—$Al_2O_3$—$SiO_2$—$B_2O_3$ glass (60 wt %)], (3) an $Al_2O_3$—($PbO$—$SiO_2$—$B_2O_3$) based material [composition: $Al_2O_3$ (55 wt %), $PbO$—$SiO_2$—$B_2O_3$ glass (45 wt %)], (4) a $BaO$—$Al_2O_3$—$SiO_2$—$CaO$—$B_2O_3$ based material [composition: $BaAl_2SiO_6$ deposited in glass phase], and (5) an $Al_2O_3$—($B_2O_3$—$SiO_2$) based material [composition: $Al_2O_3$ (50 wt %), $B_2O_3$—$SiO_2$ glass (50 wt %)].

Ceramic substrates 1 that can be obtained using these glass ceramic materials have, for example, the following characteristics:

(a) Cu-wired substrate . . . Thermal expansion coefficient: 5.9 ppm/° C., heat conductivity: 2.2 W/m.k, flexural strength: 0.2 GPa, Young's modulus: 110 GPa, and wiring resistance (sheet resistance): 3 mΩ/□.

(b) Cu-wired substrate . . . Thermal expansion coefficient: 6.2 ppm/° C., heat conductivity: 1.3 W/m.k, flexural strength: 0.2 GPa, Young's modulus: 100 GPa, and wiring resistance (sheet resistance): 3 mΩ/□.

(c) Cu-wired substrate . . . Thermal expansion coefficient: 12.2 ppm/° C., heat conductivity: 2.0 W/m.k, flexural strength: 0.2 GPa, Young's modulus: 75 GPa, and wiring resistance (sheet resistance): 3 mΩ/□.

(d) Ag-wired or Ag—Pt wired substrate . . . Thermal expansion coefficient: 6.3 ppm/° C., heat conductivity: 2.5 W/m.k, flexural strength: 0.25 GPa, Young's modulus: 75 GPa, and wiring resistance (sheet resistance): 3 mΩ/□.

(e) Ag-wired or Ag—Pt wired substrate . . . Thermal expansion coefficient: 10.4 ppm/° C., heat conductivity: 4.7 W/m.k, flexural strength: 0.21 GPa, Young's modulus: 75 GPa, and wiring resistance (sheet resistance): 3 mΩ/□.

A Pb-10 wt %Sn-5 wt %Sb-1 wt %Ag material with a melting point of 238 deg C. is selected for a solder layer 6 preferable for mounting semiconductor device base substances 7 that include integrated circuit element base substance 7A and FET element base substance 7B, and chip components such as chip resistors 9 and capacitor 10. One of the main reasons for this is that, when the semiconductor device 12 with chip components is heated for electrical connection (soldering) to external wiring board 15 at the immediately succeeding stage, solder layer 6 re-melts and flows out to prevent mutual short-circuiting between wiring patterns 4. Another major reason is that, compared with the volume of the solder material under a solid status, since the volume of the solder material under a liquid status increases by about 15%, a high internal pressure of about 0.8 GPa occurs between ceramic substrate 1 and the resin layer 11 acting as a sealer, thus preventing their separation. It is necessary, therefore, that solder layer 6 be re-molten during the soldering process that follows.

However, if such a process is established that does not cause solder layer 6 to be re-molten during the soldering process that follows, materials other than Pb-10 wt %Sn-5 wt %Sb-1 wt %Ag may be usable for solder layer 6. It is possible to use, for example, Pb—Sn based alloys represented by Pb-5 wt %Sn, Pb-3.5 wt %Sn-1.5 wt %Ag, or Pb-60 wt %Sn. Also, in recent years, it is desired in terms of environmental protection that solder materials not containing Pb should be applied. Instead of these solder materials, the following materials can also be used for the same reason:

A solder material made of Sn

Sn—Ag based solder materials represented by Sn-3.5 wt %Ag or Sn-3 wt %Ag-0.8 wt %Cu Sn—Sb based solder materials represented by Sn-5 wt %Sb or Sn-5 wt %Sb-0.6 wt %Ni0.05 wt %P Sn—Bi based solder materials represented by Sn-58 wt %Bi Sn—In based solder materials represented by Sn-52 wt %In Sn—Zn based solder materials represented by Sn-9 wt %Zn In—Ag based solder materials represented by In-10 wt %Ag Au—Sn based solder materials represented by Au-20 wt %Sn Or, an allowed material, such as Sn-8.5 wt %Zn-1.5 wt %In or Sn-4 wt %Ag-2 wt %Zn-2 wt %Bi, can also be applied that consists of an arbitrary combination of the Sn based, Sn—Ag based, Sn—Sb based, Sn—Bi based, Sn—Cu based, Sn—In based, Sn—Zn based, In—Ag based, and Au—Sn based solder materials mentioned above.

An epoxy material whose after-curing physical characteristics are, for example, 9.0 ppm/° C. in thermal expansion coefficient, 24.5 GPa in Young's modulus, 150 deg C. in glass transition temperature, and 85 wt % in the amount of filler addition, is used for resin layer 11. Instead, an epoxy resin material whose after-curing physical characteristics are, for example, 14 ppm/° C. in thermal expansion coefficient, 8.8 GPa in Young's modulus, 136 deg C. in glass transition temperature, and 74 wt % in the amount of filler addition, can also be used. It is preferable that these epoxy resin materials should their after-curing thermal expansion coefficients adjusted to stay within the range of 6–30 ppm/° C., and this can be attained by adjusting the amount of filler to be added. However, an increase in filler content for a reduced thermal expansion coefficient increases the viscosity and thus deteriorates the workability. Conversely, a decrease in filler content for a greater thermal expansion coefficient reduces viscosity and thus accelerates the precipitation of the filler. The after-curing thermal expansion coefficients of ideal epoxy resin materials, therefore, range from 9 to 20 ppm/° C. These epoxy resin materials can be produced by either printing, potting with a dispenser, or molding, and solid epoxy resin materials can be molded using a known method such as transfer molding. The epoxy resin materials that can be used include bisphenol A-type epoxy resin, tetrabromobisphenol A-type epoxy resin, bisphenol F-type epoxy resin, bisphenol A/F-type epoxy resin, bisphenol AD-type epoxy resin, phenol novolak-type epoxy resin, cresol novolak-type epoxy resin, epoxy resin having a biphenyl skeleton or naphthalene skeleton, and so on. Alicyclic epoxy resin can also be used alone or together with other epoxy resin so as to improve heat resistance. The usable types of alicyclic epoxy resin include 3,4-epoxycycloxylmethyl-(3,4epoxy)cyclohexanecarboxylate, 4-(1,2-epoxypropyl)-1,2-epoxycyclohexane, 2-(3,4-epoxy)cyclohexyl-5,5-spiro(3,4-epoxycyclohexane-m-dioxane, and so on. Either an aluminum-based curing agent, a curing agent that contains acid anhydride, phenol resin, or the like, can be used to cure epoxy resin. Diethylene triamine, bis(aminomethyl)cyclohexane, diaminodiphenyl methane, diaminodiphenyl sulfonemethane, or the like, is available as an aluminum-based curing agent. Either methyltetrahydrophthalic anhydride, methylhexahydrophthalic anhydride, nadic anhydride, or the like, is available as a curing agent that contains acid anhydride. Either phenol novolak resin, phenol alkyl resin, or the like, is available as phenol resin.

Either molten silica, crystal silica, alumina, magnesium oxide, magnesium carbonate, calcium carbonate, dolomite, aluminum hydroxide, magnesium hydroxide, calcium sulfide, magnesium sulfide, aluminum sulfide, talc, clay, mica, or the like, can be used as the filler, and these materials can be of the crushed, spherical, or fibrous form. It is preferable that these fillers should range from 0.1 to 30.0 microns in average grain size. Grain sizes less than 0.1 micron increase viscosity and deteriorate processability, and grain sizes exceeding 30.0 microns do not enable filling in narrow portions. The after-curing thermal expansion coefficient of resin layer 11 can be adjusted to the desired range by adjusting the amount of addition of the filler. An increase in the amount of addition of the filler reduces the thermal expansion coefficient, and a decrease in the amount of addition of the filler increases the thermal expansion coefficient. In addition to the filler, it is possible to add a flexibility enhancing agent, a flame-retarding agent, a coloring agent, a surface treatment agent, and/or other chemicals, as required.

The Si material for semiconductor device base substance 6 can be replaced with either a compound semiconductor consisting principally of at least one type of material selected from the group of Ga, As, Al, P, In, Sb, and C, such as a compound semiconductor represented by GaAs (6.0 ppm/° C.) or SiC (3.7 ppm/° C.), or a Ge material (6.0 ppm/° C.). Or, a combination of these materials including an Si material can also be used.

An Al material with added Au, Al, Si or Ni can be used as the base material for metallic thin wire 7. For metallic thin wire 7 using either of these materials, any diameter from 10 to 100 microns can be selected as required.

Instead of the Pb-60 wt %Sn solder material for external wiring connection layer 13, other alloyed materials can be used unless external wiring connection layer (soldered portion) 13 is not remolten during heat treatment intended for fixing purposes. It is possible to use, for example, a Pb—Sn alloy represented by Pb-85 wt %Sn. Also, in recent years, it is desired in terms of environmental protection that solder materials not containing Pb should be applied. Instead of these solder materials, the materials described above for solder layer 6 can also be used for the same reason.

External wiring board 15 can also use a glass epoxy material whose physical characteristics are, for example, 14 ppm/° C. in thermal expansion coefficient and 170 GPa in Young's modulus. Instead of a glass epoxy material, it is also possible to use either a paper phenol material based on paper and impregnated with phenol resin, a composite material based on a glass cloth or glass unwoven cloth or paper and impregnated with epoxy resin, or a glass polyimide material based on a glass cloth and impregnated with polyimide. Or, a flexible printed board having a wiring pattern formed on a polyester, polyimide, or polyimide-amide film can be used. Or, insulated boards having a wiring pattern on an aluminum substrate provided with an organic insulation layer can be used.

(Embodiment 2)

Figure 15A:
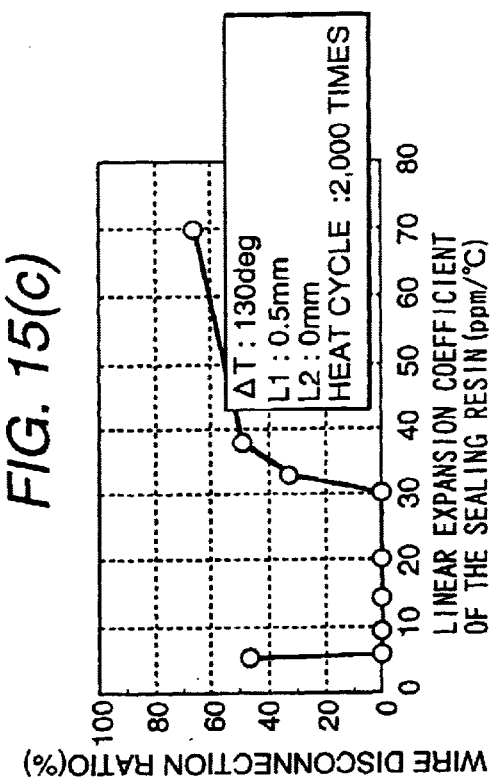
FIGS. 15(a) to 15(d) are graphs showing heat cycle test results on the semiconductor device and structural body of the present invention.
Figure 15B:
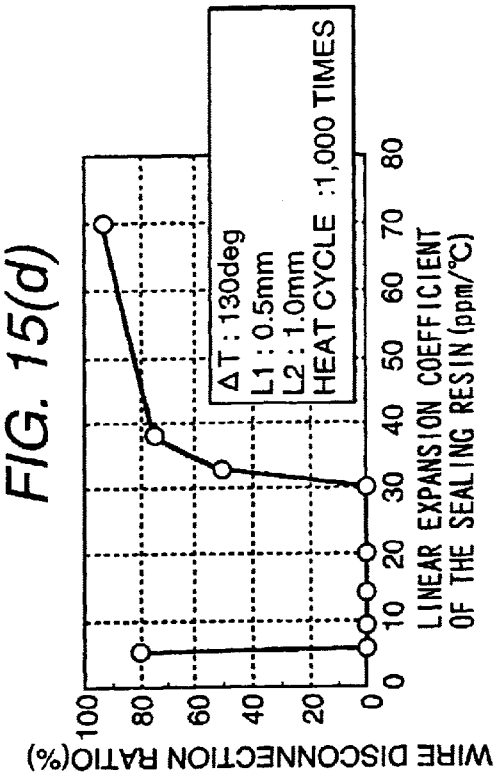

Semiconductor device 12 can likewise be obtained by varying the thermal expansion coefficient of resin layer 11 under the same unit configuration set forth in embodiment 1. In embodiment 2, L1 is fixed at 0.5 mm and L2 is set to 0.0 mm and 0.5 mm. Filler content is changed to adjust the thermal expansion coefficient. FIGS. 15(a) and 15(b) are graphs showing the wire disconnection ratios that were obtained from heat cycle tests on semiconductor device 12 of this embodiment. The corresponding wire disconnections are due to the progress of the separation which occurred at the interface between ceramic substrate 1 and resin layer 11. Data in the case of L2=0.0 mm is shown in FIG. 15(a), and data in the case of L2=0.5 mm, in FIG. 15(b). In both graphs, changes in the thermal expansion coefficient of resin layer 11 are plotted along the horizontal axis and changes in wire disconnection ratio during 2,000 heat cycles at ΔT=205 deg are plotted along the vertical axis. Both of the graphs of FIGS. 15(a) and 15(b) show a wire disconnection ratio of 0% in the thermal expansion coefficient range from 6 to 30 ppm/° C. under this embodiment. If a resin layer is provided that oversteps this thermal expansion coefficient range, the wire disconnection ratio increases significantly because a thermal expansion coefficient less than 6 ppm/° C. or greater than 30 ppm/° C. applies an excessive stress to the edge of the interface between ceramic substrate 1 and resin layer 11. This results in a separation-caused fracture of the interface and a consequential disconnection of the wiring. Provided, however, that the thermal expansion coefficient of resin layer 11 is adjusted to stay within the range shown in this embodiment, the stress applied to the edge of the interface between ceramic substrate 1 and resin layer 11 will be minimized, which will, in turn, minimize the thermal expansion coefficient.

Figure 15C:
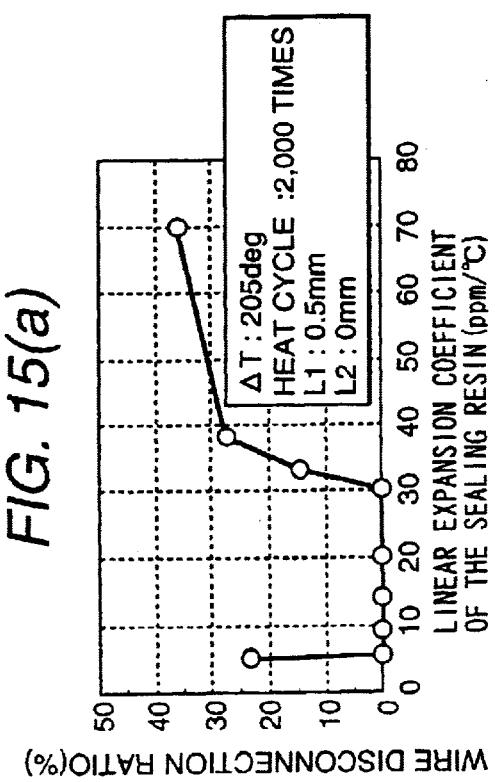
Figure 15D:
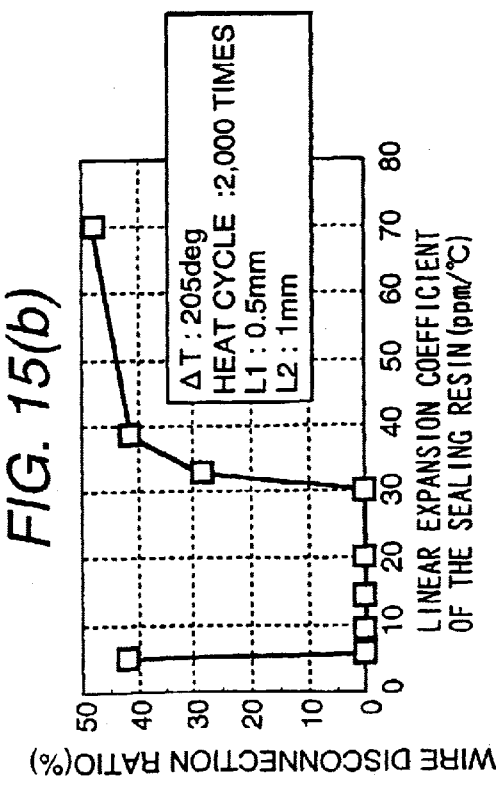

Structural body 16 whose resin layer 11 has a different thermal expansion coefficient can be prepared by mounting the above-described semiconductor device 12 on a glass epoxy material. FIGS. 15(c) and 15(d) are graphs showing the wire disconnection ratios that were obtained from heat cycle tests on structural body 16 of this embodiment. Data in the case of L2=0.0 mm is shown in FIG. 15(c), and data in the case of L2=1.0 mm is shown in FIG. 15(d). In both graphs, changes in the thermal expansion coefficient of resin layer 11 are plotted along the horizontal axis and changes in wire disconnection ratio during 1,000 heat cycles at ΔT=130 deg are plotted along the vertical axis. In structural body 16, the differences in thermal expansion coefficient between ceramic substrate 1, resin layer 11, and external wiring board 15, apply a very large stress to ceramic substrate 1, compared with the independent use of semiconductor device 12, and result in very high wire disconnection ratios as well. As shown in FIGS. 15(c) and 15(d), wire disconnection ratios at the thermal expansion coefficients overstepping the required range increase significantly, compared with the cases of FIGS. 15(a) and 15(b). In the thermal expansion coefficient range of the present embodiment, however, all wire disconnection ratios are reduced to 0%. Comparisons on this between the case of L2=0.0 mm and the case of L2=1.0 mm will be described below. In the case of L2=0.0 mm, the wire disconnection ratios under a combination of semiconductor device 12 and structural body 16 are very small, compared with the case of L2=1.0 mm. It is preferable, therefore, that the thermal expansion coefficient of resin layer 11 be adjusted to stay within the range of 6–30 ppm/° C. and that distances L1 and L2 be limited to fall within the range shown by the present invention.

In the thermal expansion coefficient range of the present embodiment, the stresses on sections A and B shown in FIG. 3 also decrease. It is possible to avoid the crack-caused fracture of ceramic substrate 1, and hence, the disconnection of the internal layer wiring, by adjusting the thermal expansion coefficient of resin layer 11 to 6–30 ppm/° C. in the structural body of the present embodiment.

(Embodiment 3)

Figure 16:
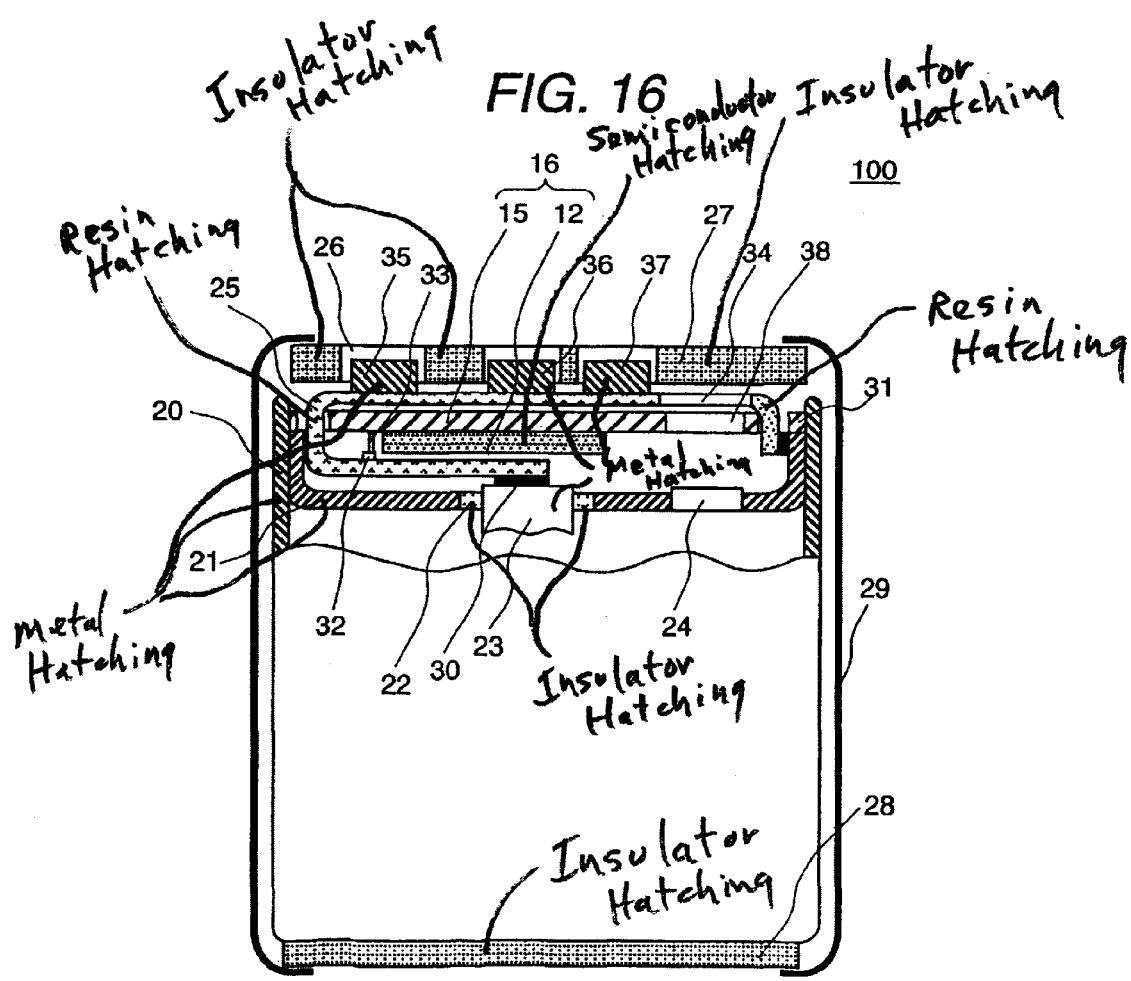
FIG. 16 is a cross-sectional view of a lithium-ion secondary battery, an embodiment of the electronic device of the present invention.

Structural body 16 in embodiment 1 can be applied to a lithium-ion secondary battery, namely, electronic device 100 shown in FIG. 16. Electronic device 100 (secondary battery measuring 60 mm by 30 mm by 8 mm) has the following configuration: secondary battery elements, including a positive electrode activation substance, a negative electrode activation substance, a positive pole current collection body, a negative pole current collection body, a separator, an organic electrolyte, and so on, are encased in a metallic casing of a bottomed prismatic shape that measures 55 mm by 29 mm by 7 mm. This battery uses $LiCoO_2$ as the positive electrode activation substance, and graphite-structured carbon is used as the negative electrode activation substance. The positive electrode activation substance is retained in the positive pole current collection body made of Al, and the negative electrode activation substance is retained in the negative pole current collection body made of Cu. The separator is located between the positive electrode activation substance and the negative electrode activation substance, and is filled with an organic electrolyte. Metallic lid 21 with a recessed cross-section is inserted into the opening of metallic casing 20 which functions as the negative electrode of the secondary battery. The middle of metallic lid 21 is provided with positive electrode 23 via insulating layer 22 made of a glass material. Metallic lid 21 also has a safety valve 24 in the required hole. Flexible printed board 25, made of polyimide and provided with Cu wiring (not shown in FIG. 16), and structural body 16, with semiconductor device 12 mounted on wiring board 15, are mounted in the space consisting of metallic lid 21 and metallic casing 20. Flexible printed board 25 and structural body 16 are connected to terminals 33 at connection portion 32. As will be described later, the semiconductor device 12 has circuit protectors to protect the secondary battery from overdischarge, overcharge, overcurrent, and overheating.

The secondary battery needs to be protected from overdischarge and overcharge are, for the following reasons. For example, if the lithium-ion secondary battery is overcharged above the required battery voltage, the resulting deposition of the lithium metal on the negative electrode, the decomposition of the positive electrode activation substance, the decomposition of the organic electrolyte, and/or the like, will short-circuit the positive and/or negative electrode, thus deteriorating battery performance. For this reason, the secondary battery must be protected from overcharge. Conversely, if the lithium-ion secondary batty is overdischarged below the required battery voltage, the resulting ionization of the metal in the negative pole current collection body will allow the ions to flow into the organic electrolyte, thus causing deterioration of the current collection function and the loss of the negative electrode activation substance, and resulting in the battery capacity being reduced. For this reason, the secondary battery must be protected from overdischarge.

Flexible printed board 25 is provided with positive-pole external terminal 35, negative-pole external terminal 36, and grounding terminal 37. Positive-pole external terminal 35 is connected to metallic casing 20 via connection portions 30 and 31, structural body 16, and the wiring (not shown) on flexible printed board 25. The holes 34 and 38 corresponding to safety valve 24 are formed on flexible printed board 25 and the external wiring board 15 of structural body 16. Insulating plate 27 with holes 26 at the positions corresponding to external terminals 35, 36, and 37, is located on flexible printed board 25. Also, insulating plate 28 is located at the bottom side of metallic casing 20. Insulating plate 27, metallic casing 20, and the outer side of insulating plate 28 are covered with heat shrinkage tube 29. A charger or an electronic unit (for example, intended to supply power to a mobile phone, a personal computer, or the like) can be connected between positive-pole external terminal 35 and negative-pole external terminal 36 to enable the practical use of the secondary battery.

Figure 17:
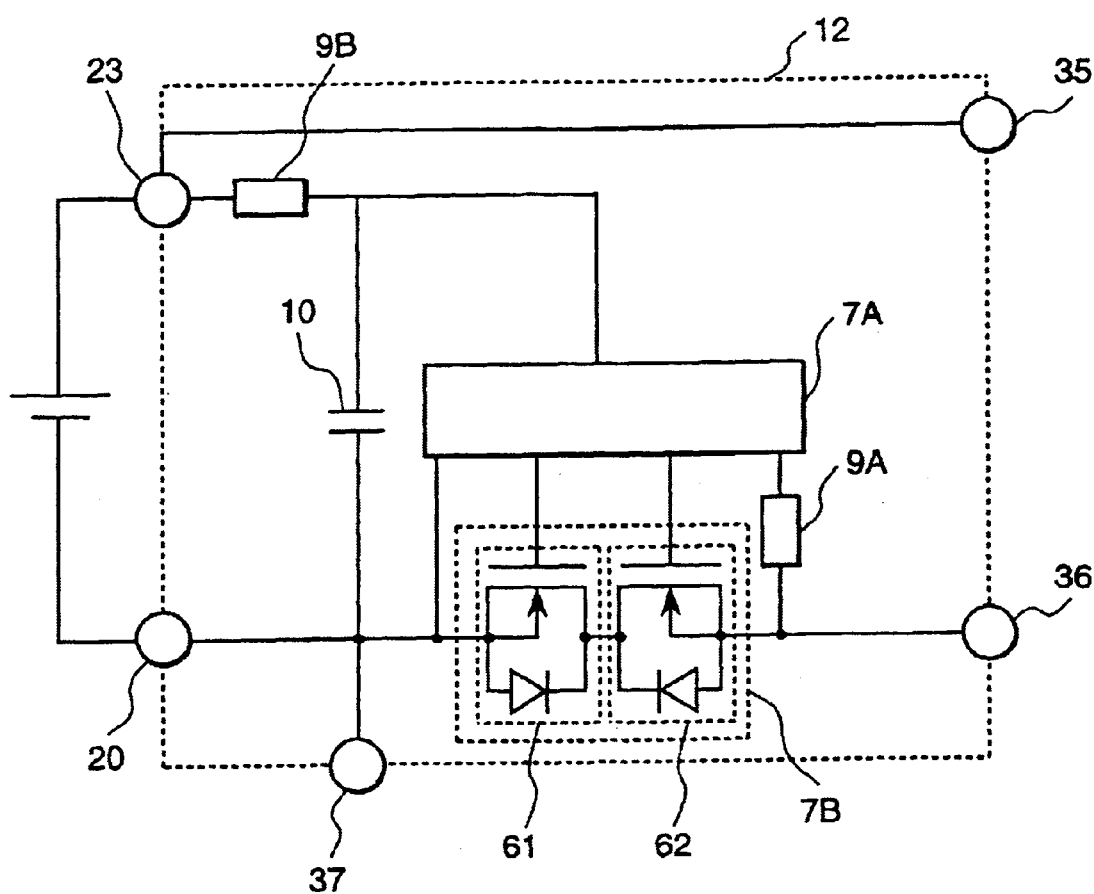
FIG. 17 is a schematic circuit diagram of the semiconductor device built into the lithium-ion secondary battery, an embodiment of the electronic device of the present invention.

The lithium-ion secondary battery, as the electronic device 100 of the present embodiment that has the configuration described above, contains the circuit of semiconductor device 12 as shown in FIG. 17. Integrated circuit element 7A, FET element 7B, chip resistors 9, and chip capacitor 10 are mounted on semiconductor device 12. The FET element 7B, consisting of overdischarge suppression FET element 61 and overvoltage suppression FET element 62, is connected between the metallic casing 20 containing the secondary battery elements (negative electrode included), and negative-pole external terminal 36. If an overvoltage is applied between positive electrode 23 and metallic casing 20, integrated circuit element 7A will turn FET element 62 off, thus suppressing overcharge. Also, if the voltage between positive electrode 23 and metallic casing 20 is reduced below the required value by overdischarge, integrated circuit element 6A will turn FET element 61 off, thus preventing the occurrence of an overcurrent.

For the conventional types of secondary batteries, such as lithium-ion secondary batteries, since the circuit protectors within these batteries use discrete-type elements, size reduction of these circuit protectors has its limits. The lithium-ion secondary battery, which is an embodiment of the electronic device according to the present invention, uses a semiconductor device provided with resin-sealed chip components as circuit protector elements on its wiring boards. For this reason, in lithium-ion secondary batteries of the same size, although the conventional metallic casing 20 measures 50 mm by 29 mm by 7 mm, the dimensions of the metallic casing 20 set forth in the present embodiment are increased to 55 mm by 29 mm by 7 mm. Correspondingly, the volume occupied by the protection circuit in the secondary battery is reduced, thereby increasing the total volume occupied by the secondary battery elements. This, in turn, enhances the capacity of the secondary battery and increases the operating time of the lithium-ion secondary battery by a factor of 1.1.

Since this semiconductor device also has a structural body so constructed as to prevent the likely occurrence of cracking of the ceramic substrate, and the consequential disconnection of the internal layer wiring, due to the thermal changes suffered if the semiconductor device is mounted on external wiring boards different in thermal expansion coefficient, this electronic device is highly reliable, excellent in performance, and high in volume efficiency, and has a high component mounting density.

The lithium-ion secondary battery, as the electronic device 100 of the present embodiment, contains a highly accurate voltage detection circuit and a delay circuit in its very compact package and has no external components. This battery is therefore suitable for a battery pack intended for mobile phone use. Some of the outstanding features or advantages of this battery are listed below.

(1) Highly accurate, built-in voltage detection circuit

Overcharge detection voltage: 3.9 to 4.4 V±25 mV

Overcharge release voltage: 3.8 to 4.4 V±50 mV

Overdischarge detection voltage: 2.3 to 3.0 V±80 mV

Overdischarge release voltage: 2.3 to 3.4 V±100 mV

Overcurrent-A detection voltage: 0.05 to 0.30 V±30 mV

Overcurrent-B detection voltage: 0.5 V±100 mV (2) High withstand voltage device (maximum rated voltage: 26 V) applied to the charger connection terminal (3) Various delay detection time constants Overcharge: 1 sec Overdischarge: 125 msec Overcurrent A: 8 msec Overcurrent B: 2 msec The above detection functions are assigned to the built-in circuit (no external capacitors required).

Compact and lightweight design based on a reduced number of components (4) Three-level built-in overcurrent detection circuit Overcurrent A, overcurrent B, and load short-circuiting Improved safety against software-based short-circuiting of the load (5) 0-V battery charge function valid/invalid selectability (6) Charger connection detection function and charge alarm current detection function contained Safety against the application of an excessive charger voltage (24 V)

(7) Low current consumption

Operating: 3.0 microamperes

Powerdown: 0.1 microampere (8) Wide operating temperature range

−40 to +85 deg C.

Examples of applicable electronic units include a vehicular mobile wireless phone, a hand-held personal computer, a portable video camera, etc. More compactness, higher reliability, and higher performance can also be achieved for electronic devices of the configurations where the semiconductor device or structural body of the present invention is mounted on the electronic units mentioned above.

(Embodiment 4)

Semiconductor 12 of this embodiment has an internal layer wiring 2, through-hole wiring 2A, external electrode portion 3, and wiring pattern 4, each of which uses a conductor having Fe—Ni alloy powder dispersed over its Cu, and has ceramic substrate 1 using an alumina material with a thermal expansion coefficient of 7.0 ppm/° C., a heat conductivity of 15.2 W/m.k, a flexural strength of 0.4 GPa, a Young's modulus of 30.0 GPa, and a wiring resistance (sheet resistance) of 4 mΩ/□. Except for internal layer wiring 2, through-hole wiring 2A, external electrode portion 3, and wiring pattern 4, the composition of each unit component and its manufacturing processes are the same as in embodiment 1, and L1 and L2 were set to 0.05 mm and 0.00 mm, respectively. Also, in embodiment 4, as with embodiment 1, semiconductor device 12 has been mounted on external wiring board 15 to obtain structural body 16. A heat cycle of ΔT=130 deg has been applied 2,000 times to the structural body 16 of embodiment 4 in order to examine the wire disconnection ratio of the structural body. As a result, structural body 16 has shown a wire disconnection ratio of 0% and this, of course, indicates that the structural body is superior to that of embodiment 1 in terms of resistance to wire disconnection. This is because the alumina substrate has a flexural strength of 0.4 GPa, which is higher than that (0.25 GPa) of the glass ceramic material in embodiment 1, and because the strength against cracking near internal layer wiring 2 and the strength against cracking-caused fracture near external electrode portion 3 are thereby enhanced.

(Embodiment 5)

A lithium-ion secondary battery has been obtained as the electronic device 100 that uses the structural body 16 of embodiment 4 described above. In this case as well, the composition of each device component, except for ceramic substrate 1, is the same as in embodiment 3. Resultingly, as with embodiment 3, although conventional metallic casing 20 measures 50 mm by 29 mm by 7 mm, the dimensions of the metallic casing 20 set forth in the present embodiment are increased to 55 mm by 29 mm by 7 mm. Correspondingly, the capacity of the secondary battery and increases in the operating time of the lithium-ion secondary battery are enhanced by a factor of 1.1.

(Embodiment 6)

Semiconductor device 12 set forth in embodiment 4 has been mounted directly on flexible printed board 25 to obtain a lithium-ion secondary battery as electronic device 100. In this case as well, external wiring board 14 is absent and the composition of each device component, except for ceramic substrate 1, is the same as in embodiment 3. Resultingly, as with embodiment 3, although conventional metallic casing 20 measures 50 mm by 29 mm by 7 mm, the dimensions of the metallic casing 20 set forth in the present embodiment are increased to 55 mm by 29 mm by 7 mm. Correspondingly, the capacity of the secondary battery and increases in the operating time of the lithium-ion secondary battery are enhanced by a factor of 1.1.

As set forth in embodiments 3, 5, and 6, the semiconductor device or structural body of the present invention can be applied to an electronic control device having a secondary battery for supplying power, and a controller for controlling the overcharge and overdischarge of the secondary battery.
(Embodiment 7)

Figure 18A:
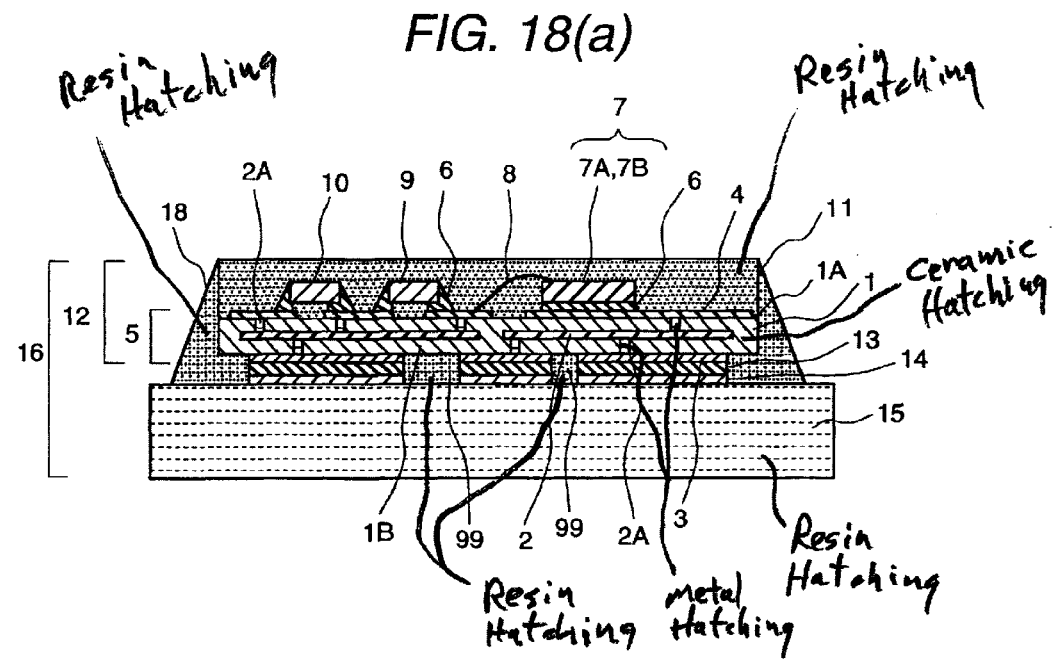
FIGS. 18(a) and 18(b) are is a cross-sectional views of the structural body of the present invention.
Figure 18B:
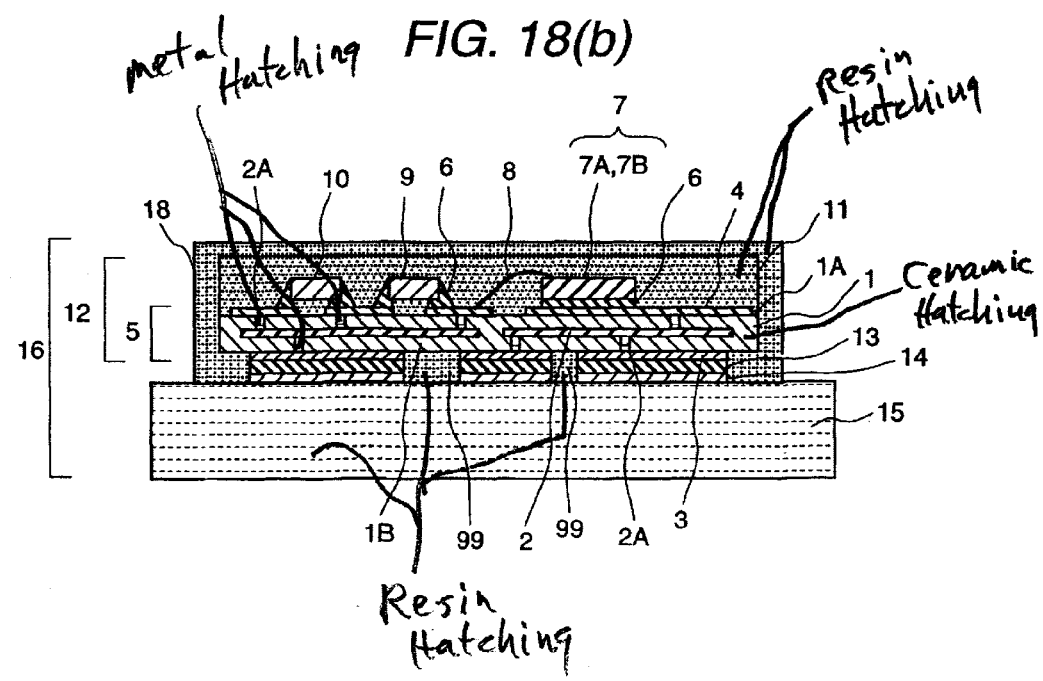

If structural body 16 has the construction described below, the yield strength of the structural body against wire disconnection further improves. A cross-sectional view of seal body 16 having a semiconductor device 12 whose L1 and L2 are both fixed at 0.5 mm in the semiconductor device of embodiment 1 is shown as FIG. 18(a). The structural body shown in FIG. 18(a) is characterized in that new epoxy resin 18 for covering the periphery is provided at the L-shaped portion formed by the side of semiconductor device 12 and wiring board 15, and in that epoxy resin 18 for space-filling is provided in the space created inside external electrode portion 3. Thus, in the case of, for example, a glass ceramic material, the stress on section B shown in FIG. 3 can be reduced below 0.25 GPa (at $\Delta T=80$ deg). In structural body 16 of the present embodiment, when a heat cycle of $\Delta T=130$ deg is applied 2,000 times, the wire disconnection ratio is 0%, which is very small, compared with structural body 16 of embodiment 1. For the structural body 16 whose L-shaped portion and resin layer 11, both shown in FIG. 18(b), are covered with new epoxy resin 18, the wire disconnection ratio can likewise be reduced. Although the structural body 16 shown in FIGS. 18(a) and 18(b) is provided with space-filling epoxy resin 18 in the space created inside external electrode portion 3, even if this space is not filled with the resin, the wire disconnection ratio can be reduced. Even in such a case, in the case of, for example, a glass ceramic material, the stress on section B shown in FIG. 7 can be reduced below 0.25 GPa (at $\Delta T=80$ deg). When a heat cycle of $\Delta T=130$ deg is applied 2,000 times, therefore, the wire disconnection ratio is 0%, which is very small, compared with structural body 16 of embodiment 1. As can be seen from these facts, the reliability based on heat cycle tests can be further enhanced by covering the periphery of the semiconductor device. In both configurations shown in FIGS. 18(a) and 18(b), all resin materials already laid open can be used as new epoxy resin 18 or space-filling epoxy resin 99.
(Embodiment 8)

Figure 19:
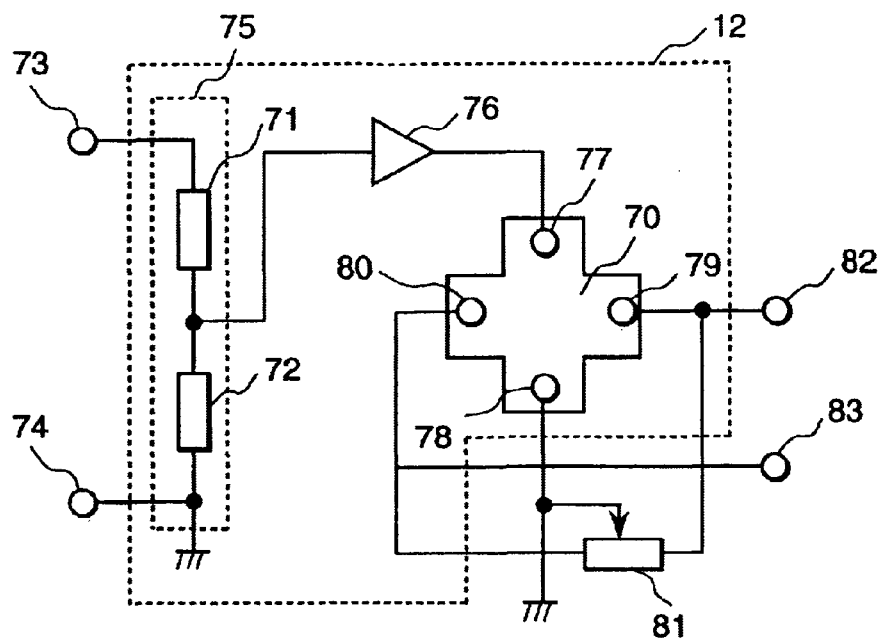
FIG. 19 is a schematic circuit diagram of an electric power multiplication circuit functioning as the semiconductor device of the present invention.

In this embodiment, a semiconductor device 12 has been provided that includes an electric power multiplication circuit. A block diagram of the electric power multiplication circuit in semiconductor device 12 of the present embodiment is shown in FIG. 19. Semiconductor device 12 comprises Hall effect element 70, voltage conversion circuit 75, and voltage-current conversion circuit 76. The chip components constituting these circuits are soldered onto wiring board composite body 5A similarly to embodiment 1. This wiring board composite body is made of an alumina material, instead of the glass ceramics used in embodiment 1, and the alumina material is provided with FE—Ni alloy powder dispersed over Cu and has a thermal expansion coefficient of 7.0 ppm/° C., a heat conductivity of 15.2 W/m.k, a flexural strength of 0.4 GPa, a Young's modulus of 300 GPa, and a wiring resistance (sheet resistance) of 4 mΩ/□. As with embodiment 1, soldering is followed by wire bonding, resin molding, and individual splitting. The dimensions of semiconductor device 12 are reduced to 15.0 mm by 10.0 mm by 1.2 mm, and L1 and L2 are fixed at 0.5 mm and 0.0 mm, respectively. Wiring board 1 in this case satisfies the above-mentioned requirements of primary importance and secondary importance. This semiconductor device 12, as with the one in embodiment 1, is of a compact, lightweight, and thin design, suitable for mass production and surface mounting, and can avoid cracking of the ceramic substrate 1, and the disconnection of internal layer wiring 2, due to thermal changes. Since ceramic substrate 1, in particular, has a high mechanical strength, the strength against cracking near internal layer wiring 2 and the yield strength against cracking-caused fracture near external electrode portion 3 are high and an excellent yield strength against wire disconnection is achieved.

Figure 20:
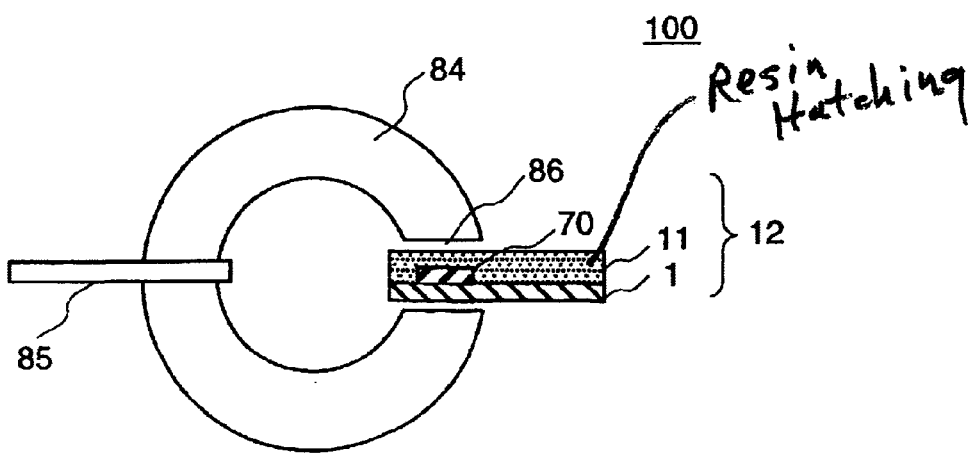
FIG. 20 is a diagram of the magnetic field generator used in the semiconductor device of the present invention.

A block diagram of the magnetic field generator is shown in FIG. 20. The magnetic field generator comprises the core 84 of a magnetic substance, current coil 85 wound around core 84, magnetic field gap 86, and semiconductor device 12 with Hall effect element 70 in magnetic field gap 86.

The functions of semiconductor device 12 will be described with reference to FIGS. 19 and 20. After being supplied to input terminals 73 and 74, the supply voltage of the system to be measured is applied to voltage-current conversion circuit 76 via voltage conversion circuit 75 consisting of resistors 71 and 72. A current proportional to the input voltage is then sent from voltage-current conversion circuit 76 to the control current terminal 77 of Hall effect element 70. The current of the system to be measured is supplied to current coil 85, and, as a result, a magnetic field proportional to the input current is developed at gap 86, and a Hall electromotive force is generated at the voltage output terminals 79 and 80 of the Hall effect element 70 located orthogonally with respect to the direction of flow of the control current into both the magnetic field of gap 86 and said Hall effect element 70. Variable resistor 81 for compensating the offset voltage arising from the asymmetry of the characteristics of Hall effect element 70 is connected between voltage output terminals 79 and 80, and movable terminal 78 is connected to the ground. Output signals are sent from output terminals 82 and 83 to external units.

The magnetic field generator, consisting of the above components, is used as the electric power multiplication circuit in a wattmeter or watt-hour meter. This wattmeter or watt-hour meter is reduced in size and weight, and is simplified in structure.
(Embodiment 9)

In this embodiment, semiconductor device 12 has been obtained as a hybrid integrated circuit unit or a high-frequency power amplification unit (high-frequency power module) used in cellular phone dialing applications, in particular.

Figure 21A:
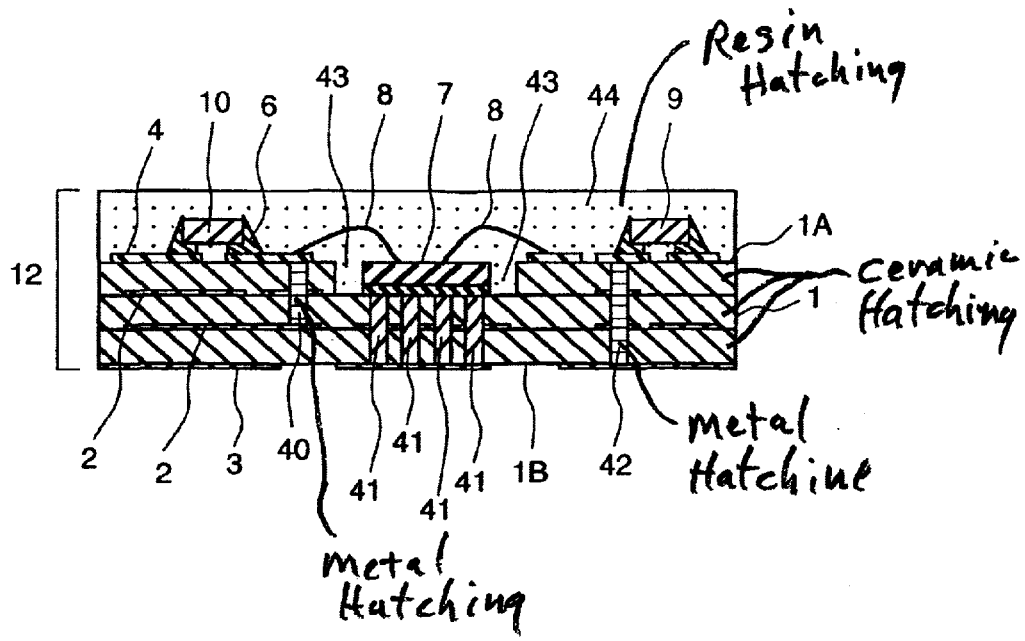
FIGS. 21(a) and 21(b) are is a cross-sectional views of the semiconductor device of the present invention.

A cross-sectional view of the high-frequency power module as the semiconductor device 12 (dimensions: 8.0 mm×12.3 mm×2.5 mm) of the present embodiment, is shown in FIG. 21(a). Ceramic substrate 1 is made of a glass ceramic material having a thermal expansion coefficient of 6.2 ppm/° C., a heat conductivity of 2.5 W/m.k, a flexural strength of 0.25 GPa, a Young's modulus of 110 GPa, and a dielectric constant of 5.6 (1 MHz). The interior of this ceramic substrate 1 is provided with two layers of internal layer wiring 2 (Ag-1 wt %Pt, 0.015 mm thick), and L1 is fixed at 0.5 mm. Blind-type (via) 40 (Ag-1 wt %Pt, 0.14 mm in diameter), thermal (via) 41 (Ag-1 wt %Pt, 0.14 mm in diameter), and through (via) 42 (Ag-1 wt %Pt, 0.14 mm in diameter) are also provided. The first principal plane 1A of ceramic substrate 1 has wiring pattern 4 (Ag-1 wt %Pt, 0.015 mm thick). Chip components consisting of chip resistor 9 (approx. 7 ppm/° C.) and chip capacitor 10 (approx 11.5 ppm/° C.) are electroconductively fixed to said wiring pattern 4 via solder layer 6 composed of Pb-10 wt %Sn-5 wt %Sb-1 wt %Ag (melting point: 238 deg C.). Semiconductor device base substance 7 (Si, 3.5 ppm/° C.), which includes integrated circuit element base substance 7A (not shown) and FET element base substance 7B (not shown), is electroconductively fixed to the bottom of rectangular recess 43 in the first principal plane 1A via solder layer 6. Also, at the required portion between semiconductor device base substance 7 and wiring pattern 4, metallic thin wire 8 made of Au is provided with bonding (integrated circuit element base substance 7A: 27 microns in diameter, FET element base substance 7B: 50 microns in diameter). On the second principal plane 1B of ceramic substrate 1, external electrode portion 3 (Ag-1 wt %Pt, 0.0115 mm thick) is provided for L2=0 mm External electrode portion 3 is electrically connected to wiring pattern 4 via the internal layer wiring 2 and through-hole wiring 2A (not shown) provided inside ceramic substrate 1. Instead of the filler used in resin layer 11 of embodiment 1, 40 vol % brown iron oxide is added to resin layer 44 on the first principal plane 1A in order to obtain an electromagnetic shielding function.

Instead of brown iron oxide, metal magnetic powder substances or ferrite powder can likewise be used to give an electromagnetic shielding function. These types of metal magnetic powder substances or ferrite powder include: silicon steel (Fe-4 wt %Si), grain oriented silicon steel (Fe-3 wt %Si), alperm (Fe-16 wt %Al), Sendust (Fe-5 wt %Al-10 wt %Si), 78-Permalloy (Fe-78.5 wt %Ni), Supermalloy (Fe-5 wt %Mo-79 wt %Ni-78.5 wt %Ni), mu-metal (Fe-5 wt %Cu-2 wt %Cr-77 wt %Ni), Permendar (FE-50wt %Co), 45–25-perminvar (Fe-45 wt %Ni-25 wt %Co), for example.

Figure 21B:
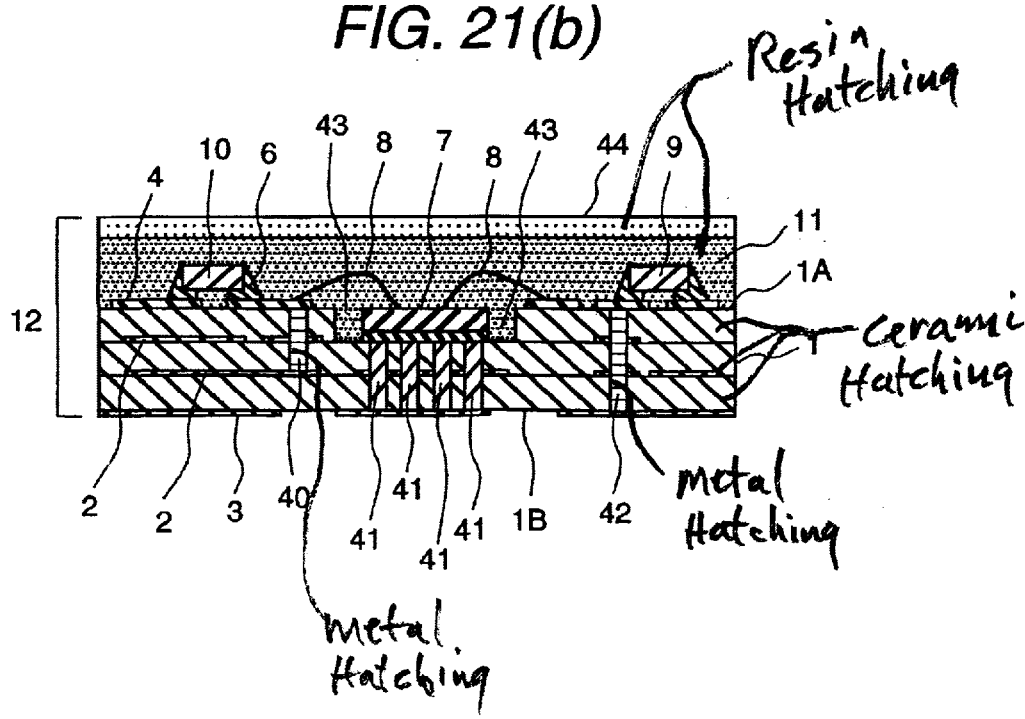

After sealing with the resin layer 11 that is used in embodiment 1 has been conducted as shown in FIG. 21(b), resin layer 44 for achieving an electromagnetic shielding function can also be provided. Ceramic substrate 1 in this case satisfies said requirements of primary importance and secondary importance. This semiconductor device 12, as with one shown in embodiment 1, is of a compact, lightweight, and thin design, suitable for mass production and surface mounting, and can avoid the cracking of ceramic substrate 1, and the disconnection of internal layer wiring 2, due to thermal changes.

Figure 22:
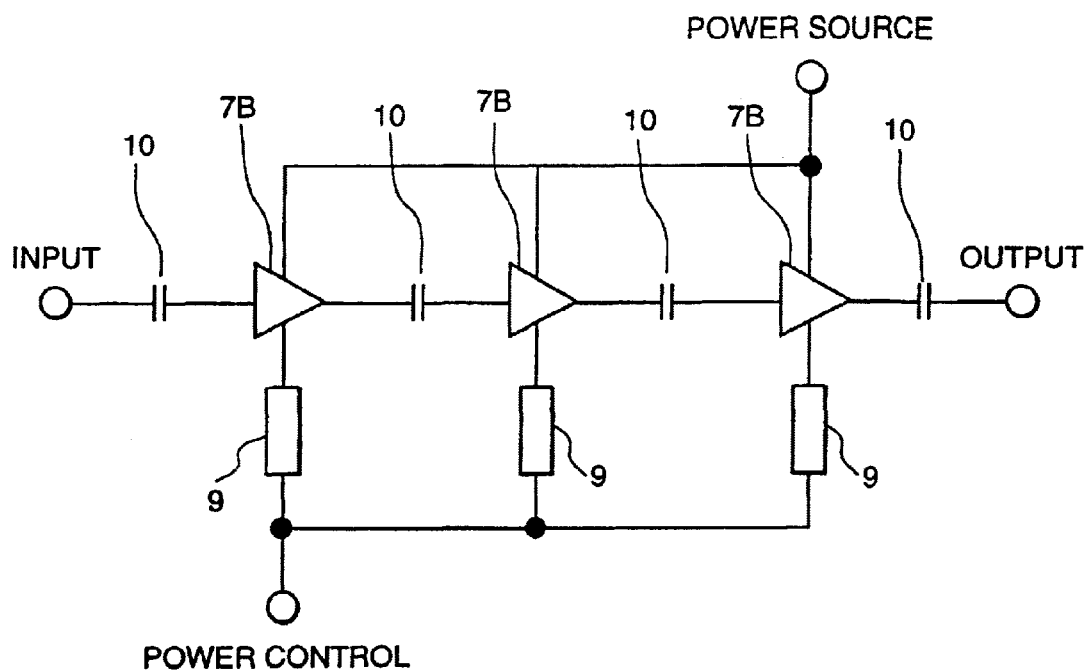
FIG. 22 is a schematic circuit diagram of the electric power multiplication circuit functioning as the semiconductor device of the present invention.

A circuit block diagram of the high-frequency power module as the semiconductor device 12 described in the present embodiment, is shown in FIG. 22. Semiconductor device 12 consists of FET elements 7B, chip resistors 9, and chip capacitors 10.

Figure 23:
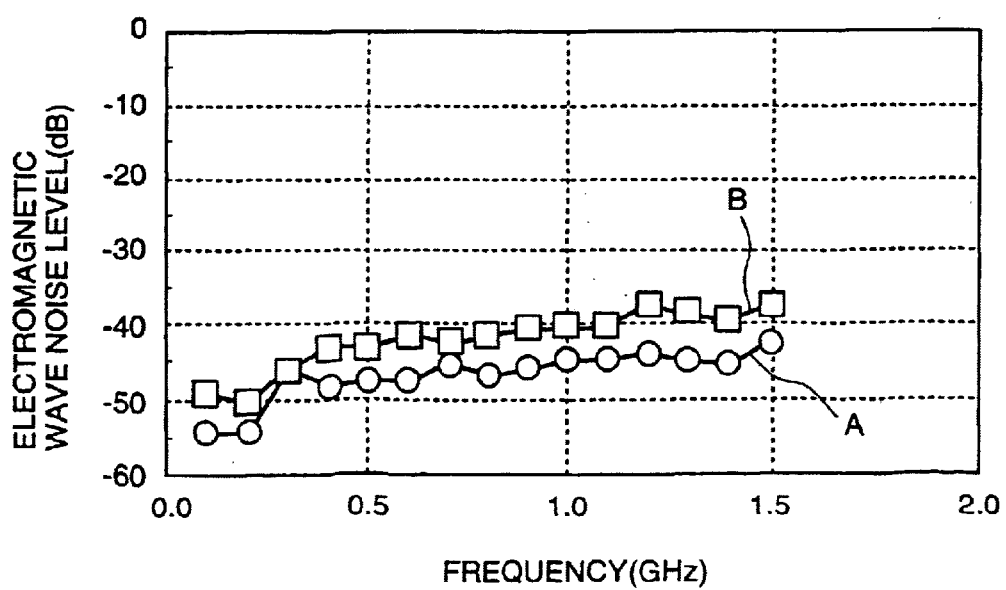
FIG. 23 is a graph showing measurement results on the electromagnetic wave noise levels for the present invention.

FIG. 23 is a graph showing measurement results on the electromagnetic noise levels of semiconductor device 12 shown in FIG. 21(a). Curve A denotes the noise levels that were measured around semiconductor device 12 during its operation, and this curve is based on the noise levels of the semiconductor device that were measured by use of a comparative test piece which applied the resin layer 11 of embodiment 1 and had no added brown iron oxide or metal magnetic power substance or ferrite powder. (In this case, the circuit composition and dimensions of the semiconductor device were the same as those of the semiconductor device shown in the present embodiment. Hereinafter, the former semiconductor device is referred to simply as the comparative semiconductor device sample). It can be seen from curve A that the levels of the noise emitted from the semiconductor device shown in the present embodiment are significantly lower than in the case of the comparative semiconductor device sample. Also, curve B denotes the levels of the electromagnetic noise which was induced into semiconductor device 12 when noise was generated near the periphery of semiconductor device 12. Data in this case as well is based on the data relating to the comparative semiconductor device sample. It can be seen from curve B that the levels of the noise induced into the semiconductor device shown in the present embodiment are significantly lower than in the case of the comparative semiconductor device sample. Thus, it is confirmed that excellent electromagnetic wave shielding performance is assigned to the semiconductor device of the present embodiment.

Figure 24:
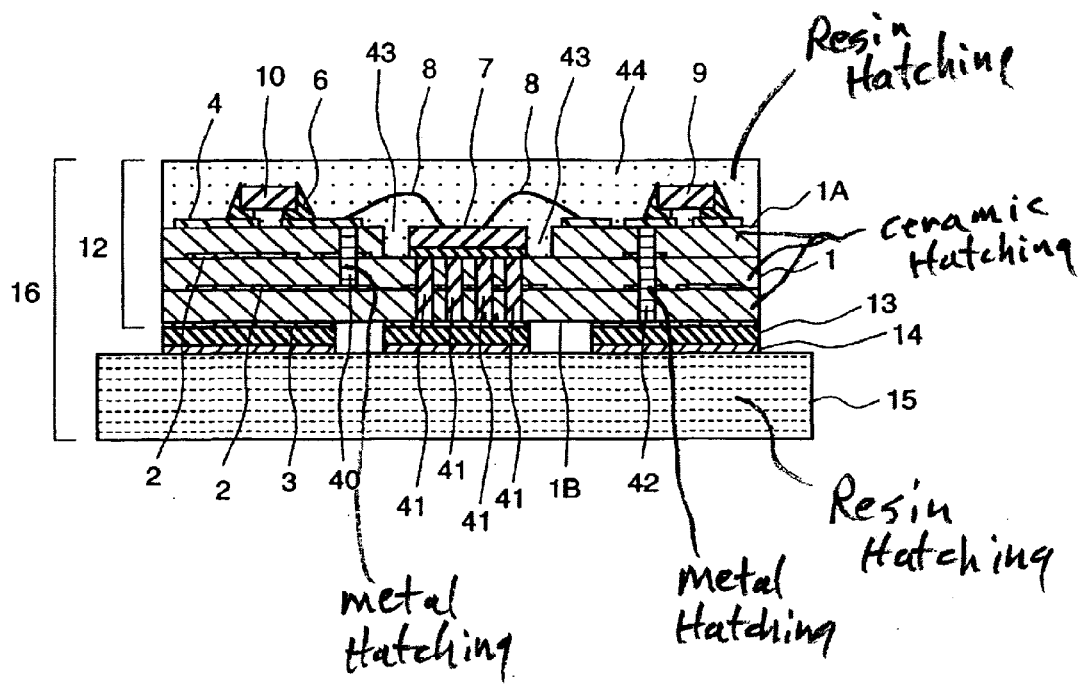
FIG. 24 is a cross-sectional view of the structural body of the present invention.

An example of the structural body 16 mounted on the external wiring board 15 of a mobile phone is shown in FIG. 24. A glass epoxy material having a thermal expansion coefficient of 14.0 ppm/° C. and a Young's modulus of 170 GPa and measuring 15.0 mm by 20.0 mm by 1.2 mm is used as the external wiring board 15, a Cu material 25 microns thick is used as the external wiring 14, and a Pb-60 wt %Sn solder material with a melting point of 183 deg C. is used as the external wiring connection layer 13. This structural body 16 is also excellent in reliability, since it can avoid the cracking of ceramic substrate 1, and the disconnection of internal layer wiring 2, due to thermal changes.

Figure 25:
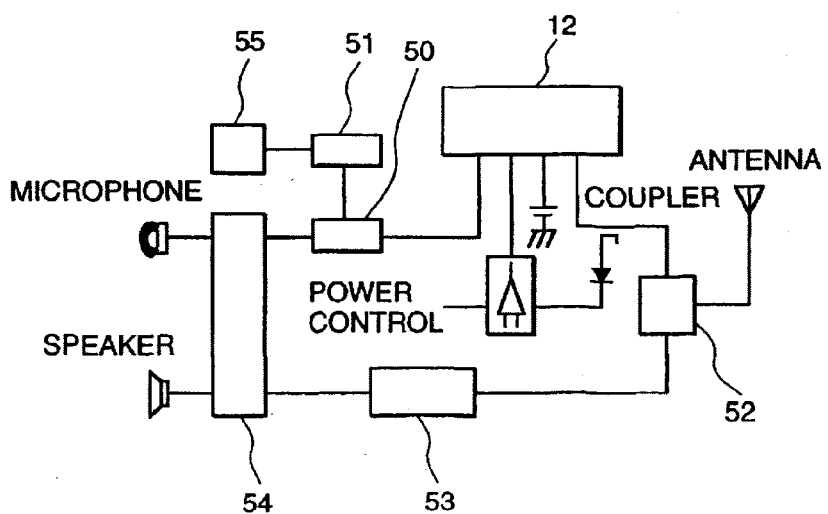
FIG. 25 is a block diagram of a mobile phone functioning as the semiconductor device of the present invention.

A circuit block diagram of a mobile phone using the semiconductor device 12 of the present embodiment is shown in FIG. 25. Input audio signals are converted into the high-frequency signals of transmitter 51 by a mixer 50, and then the signals are radiated as radio waves from the antenna of the phone via a power amplifier (namely, the semiconductor device 12 of the present embodiment) and antenna sharing unit 52. Electric transmission power is monitored by a coupler and kept constant by the control signals to the power amplifier (the semiconductor device 12 of the present embodiment). Antenna sharing unit 52 and the antenna are the loads referred to here in accordance with the present invention.

Mobile phones of the above-described configuration are reduced in size and weight, and are simplified in structure.

As heretofore described, according to the present invention, it is possible to provide a semiconductor device provided with the appropriate preventive measures to avoid the separation between the internal layer wiring of a wiring board and a ceramic substrate. It is also possible to provide a semiconductor device with the appropriate preventive measures to avoid ceramic substrate cracking at the connections between the ceramic substrate of the wiring board and an external electrode portion.

What is claimed is:

1. A semiconductor device comprising:
   a ceramic substrate provided with first and second principal planes,
   a wiring pattern formed on said first principal plane,
   an external electrode portion formed on said second principal plane and connected to an external circuit,
   internal layer wiring formed inside said ceramic substrate to electrically connect said wiring pattern and said external electrode portion via through-hole wiring,
   semiconductor components connected to said wiring pattern, and
   a resin layer for covering said first principal plane and said semiconductor components;
   wherein said internal layer wiring is located such that it is formed internally with respect to a side of said ceramic substrate with a clearance of at least 0.05 mm and;
   wherein the wiring pattern, the internal layer wiring and the external electrode are each made of at least one of metals selected from a group consisting of Ag, Pt, Cu, Pd and Au.

2. A semiconductor device as set forth in claim 2,
   wherein a side of said external electrode portion is formed on essentially the same plane as the side of said ceramic substrate.

3. An electronic device having a secondary battery, which supplies power, and a controller, which controls the overcharge and overdischarge of said secondary battery, wherein said controller is such that it has the semiconductor device set forth in either claim 1 or 2.

4. A semiconductor device as set forth in claim 1 or 2, wherein the linear expansion coefficients of the ceramics constituting said ceramic substrate range from 0.59 to 21.00 ppm/° C. and the linear expansion coefficients of the resin constituting said resin layer range from 6.00 to 30.00 ppm/° C.

5. A semiconductor device according to claim 1, wherein said ceramic substrate is a cold-baked ceramic.

6. A structural body comprising:

a ceramic substrate provided with first and second principal planes, a wiring pattern formed on said first principal plane, an external electrode portion formed on said second principal plane and connected to an external circuit, internal layer wiring formed inside said ceramic substrate to electrically connect said wiring pattern and said external electrode portion, semiconductor components connected to said wiring pattern, a resin layer for covering said first principal plane and said semiconductor components, and an external wiring board connected to said electrode portion;

wherein said internal layer wiring is located such that it is formed with a distance of at least 0.05 mm from an end of the wiring to a side of said ceramic substrate and;

wherein the wiring pattern, the internal layer wiring and the external electrode are each made of at least one of metals selected from a group consisting of Ag, Pt, Cu, Pd and Au.

7. A semiconductor body as set forth in claim 6, wherein a side of said external electrode portion is formed on essentially the same plane as the side of said ceramic substrate.

8. A semiconductor body as set forth in claim 6 or 7, wherein the linear expansion coefficients of the ceramics constituting said ceramic substrate range from 0.59 to 21.00 ppm/° C. and the linear expansion coefficients of the resin constituting said resin layer range from 6.00 to 30.00 ppm/° C.

9. An electronic device having a secondary battery, which supplies power, and a controller, which controls the overcharge and overdischarge of said secondary battery, wherein said controller is such that it has the structural body set forth in either claim 6 or 7.

10. A semiconductor device according to claim 6, wherein said ceramic substrate is a cold-baked ceramic.

11. A semiconductor device comprising:

a ceramic substrate provided with first and second principal planes, wherein said ceramic substrate is a cold-baked substrate;

a wiring pattern formed on said first principal plane;

an external electrode portion formed on said second principal plane and connected to an external circuit;

internal layer wiring formed inside said ceramic substrate to electrically connect said wiring pattern and said external electrode portion via through-hole wiring;

semiconductor components connected to said wiring pattern;

a resin layer covering said first principal plane and said semiconductor components; and means for preventing disconnection of the internal layer wiring from the ceramic substrate, said means comprising spacing the internal wiring from the side of the ceramic substrate by a distance to reduce stress between the ceramic substrate and the internal layer wiring.

12. A semiconductor device according to claim 11, wherein said means for preventing disconnection comprises spacing the internal wiring to be at least 0.05 mm from the side of the ceramic substrate.

13. A semiconductor device according to claim 12, wherein said ceramic substrate is formed at a temperature of about 1000° C.

14. A semiconductor device according to claim 13, wherein the internal layer wiring is comprised of a material from a group consisting of one of copper, silver and gold.

15. A semiconductor device according to claim 12, wherein the internal layer wiring is comprised of a material from a group consisting of one of copper, silver and gold.

16. A semiconductor device according to claim 11, wherein said ceramic substrate is formed at a temperature of about 1000° C.

17. A semiconductor device according to claim 16, wherein said ceramic substrate is formed at a temperature of about 1000° C.

18. A semiconductor device according to claim 11, wherein the internal layer wiring is comprised of a material from a group consisting of one of copper, silver and gold.

19. A semiconductor device according to claim 11, wherein the wiring pattern, the internal layer wiring and the external electrode are each made of at least one of metals selected from a group consisting of Ag, Pt, Cu, Pd and Au.

* * * * *